United States Patent
Saito et al.

(10) Patent No.: US 12,291,541 B2
(45) Date of Patent: May 6, 2025

(54) COMPOUND, THIN-FILM FORMING RAW MATERIAL, AND METHOD OF PRODUCING THIN-FILM

(71) Applicant: ADEKA CORPORATION, Tokyo (JP)

(72) Inventors: Akio Saito, Tokyo (JP); Yutaro Aoki, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 505 days.

(21) Appl. No.: 17/775,716

(22) PCT Filed: Nov. 16, 2020

(86) PCT No.: PCT/JP2020/042597
§ 371 (c)(1),
(2) Date: May 10, 2022

(87) PCT Pub. No.: WO2021/106652
PCT Pub. Date: Jun. 3, 2021

(65) Prior Publication Data
US 2022/0396590 A1    Dec. 15, 2022

(30) Foreign Application Priority Data

Nov. 27, 2019   (JP) .................................. 2019-214264

(51) Int. Cl.
| | | |
|---|---|---|
| C07F 5/00 | (2006.01) | |
| C23C 16/34 | (2006.01) | |
| C23C 16/40 | (2006.01) | |
| C23C 16/455 | (2006.01) | |

(52) U.S. Cl.
CPC ................ C07F 5/00 (2013.01); C23C 16/34 (2013.01); C23C 16/407 (2013.01); C23C 16/45525 (2013.01)

(58) Field of Classification Search
CPC ............................ C07F 5/00; C23C 16/45553
See application file for complete search history.

(56) References Cited

U.S. PATENT DOCUMENTS

| | | |
|---|---|---|
| 6,329,540 B1 | 12/2001 | Kim et al. |
| 2008/0063793 A1 | 3/2008 | Abrams et al. |
| 2014/0335363 A1 | 11/2014 | Koh et al. |
| 2016/0326008 A1 | 11/2016 | Koh et al. |

FOREIGN PATENT DOCUMENTS

| | | |
|---|---|---|
| JP | 2001-48886 | 2/2001 |
| JP | 2010-502558 | 1/2010 |
| JP | 2015-506416 | 3/2015 |
| JP | 2016-149493 | 8/2016 |
| JP | 2018-90855 | 6/2018 |
| WO | 2008/030276 | 3/2008 |

OTHER PUBLICATIONS

O'Donoghue, et al. 42 New Journal of Chemistry 3196-3210 (2018) (Year: 2018).*
Knapp, et al, 140 Polyhedron 35-41 (2018) ("Knapp"). (Year: 2018).*
J. Turner, et al, 4 Chemical Science 4245-4250 (2013) ("Turner") (Year: 2013).*
Joshua Turner et al. "Formation of sub-valent carbenoid ligands by metal-mediated dehydrogenation chemistry: coordination and activation of $H_2Ga\{(NDippCMe)_2CH\}$", Chemical Science, vol. 4, pp. 4245-4250, 2013.
International Search Report issued Jan. 12, 2021 in International (PCT) Application No. PCT/JP2020/042597.
Cosham et al., "Synthesis, Structure and Chemical Vapour Deposition Studies on the Group 13 Complexes $[Me_2M\{tfacnac\}]$ [M=Al, Ga, In; $Htfacnac=F_3CC(OH)CHC(CH_3)NCH_2CH_2OCH_3$]", European Journal of Inorganic Chemistry, 2016, No. 11, pp. 1712-1719.
Chen et al., "Theoretical Study of the Reactivities of Neutral Six-Membered Carbene Analogues of the Group 13 Elements", Organometallics, 2006, vol. 25, No. 11, pp. 2766-2773.
Extended European Search Report issued Feb. 14, 2024 in corresponding European Patent Application No. 20894682.2.

(Continued)

*Primary Examiner* — Alexander R Pagano
*Assistant Examiner* — Frank S. Hou
(74) *Attorney, Agent, or Firm* — Wenderoth, Lind & Ponack, L.L.P.

(57) ABSTRACT

Provided is a compound represented by the following general formula (1) or (2):

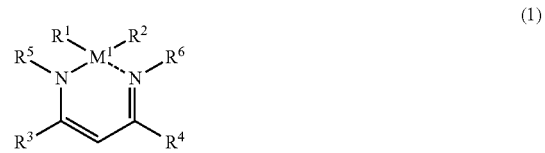

where $R^1$ to $R^4$ each independently represent a hydrogen atom, an alkyl group having 1 to 5 carbon atoms, or the like, $R^5$ and $R^6$ each independently represent a hydrogen atom or an alkyl group having 1 to 5 carbon atoms, $M^1$ represents a gallium atom or an indium atom;

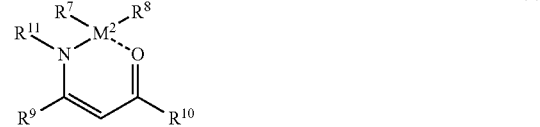

where $R^7$ to $R^{10}$ each independently represent a hydrogen atom, an alkyl group having 1 to 5 carbon atoms, or the like, $R^{11}$ represents a hydrogen atom or an alkyl group having 1 to 5 carbon atoms, and $M^2$ represents a gallium atom or an indium atom.

9 Claims, 4 Drawing Sheets

(56) References Cited

OTHER PUBLICATIONS

Caroline E. Knapp et al., "Metal β-diketoiminate precursor use in aerosol assisted chemical vapour deposition of gallium- and aluminium-doped zinc oxide", Polyhedron, vol. 140, pp. 35-41, 2018.

Richard O'Donoghoe et al., "Moleculax engineering of Ga-ketoiminates: synthesis, structure and evaluation as precursors for the additive-free spin-coated deposition of gallium oxide thin films", Royal Society of Chemistry, New J. Chem., vol. 42, pp. 3196-3210, 2018.

Wolfgang W. Schoeller, "Neutral Carbene Analogues of Group 13 Elements: The Dimerization Reaction to a Biradicaloid". Inorganic Chemistry, vol. 50, pp. 2629-2633, 2011.

* cited by examiner

COMPOUND, THIN-FILM FORMING RAW MATERIAL, AND METHOD OF PRODUCING THIN-FILM

TECHNICAL FIELD

The present invention relates to a novel compound, a thin-film forming raw material containing the compound, and to a method of producing a thin-film including using the thin-film forming raw material.

BACKGROUND ART

A thin-film material containing a gallium element or an indium element shows specific electrical characteristics, and hence has been applied to a wide variety of technologies. The material has been used as, for example, an oxide semiconductor and a nitride semiconductor used for a LED, a solar cell, a power semiconductor device, or the like, an electrode material for a memory element, a resistance film, a diamagnetic film used for the recording layer of a hard disk, and a catalyst material for a polymer electrolyte fuel cell.

As a method of producing the thin-film, there are given, for example, a sputtering method, an ion plating method, metal organic decomposition (MOD) methods, such as a coating thermal decomposition method and a sol-gel method, and chemical vapor deposition methods. Of those, chemical vapor deposition (hereinafter sometimes simply referred to as "CVD") methods including an atomic layer deposition (ALD) method are optimum production processes because the methods each have many advantages, such as excellent composition controllability and step coverage, suitability for mass production, and capability of hybrid integration.

There are a large number of reports on various raw materials as supply sources for a gallium atom and an indium atom to be used in the chemical vapor deposition method. For example, as a raw material for producing a gallium nitride thin-film, in Patent Document 1, there is disclosed triethylgallium, and in Patent Document 2, there is disclosed an azidodialkylgallium. In addition, in Patent Document 3, there is disclosed dimethylgallium acetylacetonate as a dopant material to be doped into a zinc oxide film. In addition, as a raw material for producing an oxide film containing indium, in Patent Document 4, there is disclosed bistrimethylsilyl diethylindium, and in Patent Document 5, there is disclosed ethylcyclopentadienylindium.

CITATION LIST

Patent Document

Patent Document 1: JP 2016-149493 A
Patent Document 2: JP 2001-048886 A
Patent Document 3: JP 2010-502558 A
Patent Document 4: JP 2015-506416 A
Patent Document 5: JP 2018-090855 A

SUMMARY OF INVENTION

Technical Problem

In a method including vaporizing a compound to form a thin-film such as the CVD method, the compound (precursor) to be used as a raw material is particularly required to have the following properties: the compound has a low melting point (the compound is preferably a liquid at normal temperature); and the compound can produce a high-quality thin-film with satisfactory productivity. However, the conventional gallium compounds and indium compounds to be used as thin-film forming raw materials have not been sufficiently satisfactory in terms of those properties.

Accordingly, an object of the present invention is to provide a gallium compound and an indium compound, which have melting points lower than those of the conventional gallium compounds and indium compounds, and can produce high-quality thin-films with satisfactory productivity when used as thin-film forming raw materials as compared to the conventional compounds.

Solution to Problem

The inventors of the present invention have made investigations, and as a result, have found that a gallium compound and an indium compound each including a ligand having a specific structure can solve the above-mentioned problems. Thus, the inventors have reached the present invention.

That is, the present invention relates to a compound represented by the following general formula (1) or (2):

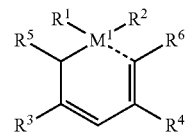
(1)

where $R^1$ to $R^4$ each independently represent a hydrogen atom, an alkyl group having 1 to 5 carbon atoms, or a group represented by the following general formula (X-1), (X-2), or (X-3), $R^5$ and $R^6$ each independently represent a hydrogen atom or an alkyl group having 1 to 5 carbon atoms, $M^1$ represents a gallium atom or an indium atom, and part or all of hydrogen atoms in the alkyl group having 1 to 5 carbon atoms represented by each of $R^1$ to $R^6$ may each be substituted with a fluorine atom;

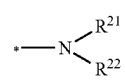
(X-1)

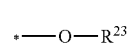
(X-2)

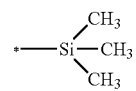
(X-3)

where $R^{21}$ to $R^{23}$ each independently represent an alkyl group having 1 to 5 carbon atoms, and * represents a bonding site;

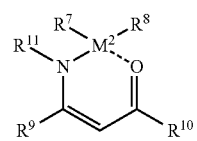
(2)

where $R^7$ to $R^{10}$ each independently represent a hydrogen atom, an alkyl group having 1 to 5 carbon atoms, or a group represented by the following general formula (Y-1), (Y-2), or (Y-3), $R^{11}$ represents a hydrogen atom or an alkyl group having 1 to 5 carbon atoms, and $M^2$ represents a gallium atom or an indium atom, provided that when $R^7$ and $R^8$ each represent a methyl group, $R^{11}$ represents a hydrogen atom, a primary alkyl group having 1 to 5 carbon atoms, or a tertiary alkyl group having 4 or 5 carbon atoms, and part or all of hydrogen atoms in the alkyl group having 1 to 5 carbon atoms represented by each of $R^7$ to $R^{11}$ may each be substituted with a fluorine atom;

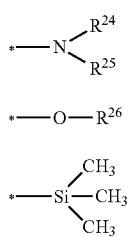

(Y-1)

(Y-2)

(Y-3)

where $R^{24}$ to $R^{26}$ each independently represent an alkyl group having 1 to 5 carbon atoms, and * represents a bonding site.

The present invention also relates to a thin-film forming raw material, including the above-mentioned compound.

The present invention also relates to a method of producing a thin-film, including the steps of: introducing a raw material gas obtained by vaporizing the above-mentioned thin-film forming raw material into a treatment atmosphere in which a substrate is set; and subjecting the compound in the raw material gas to decomposition and/or a chemical reaction, to thereby form a thin-film containing a gallium atom or an indium atom on a surface of the substrate.

Advantageous Effects of Invention

According to the present invention, the gallium compound and the indium compound, which have melting points lower than those of the conventional gallium compounds and indium compounds, and can produce high-quality thin-films with satisfactory productivity when used as thin-film forming raw materials as compared to the conventional compounds, can be provided. The compound of the present invention is suitable as a thin-film forming raw material for a CVD method. In particular, the compound has an ALD window, and hence can be preferably used as a thin-film forming raw material for an ALD method.

DESCRIPTION OF EMBODIMENTS

Figure 1:
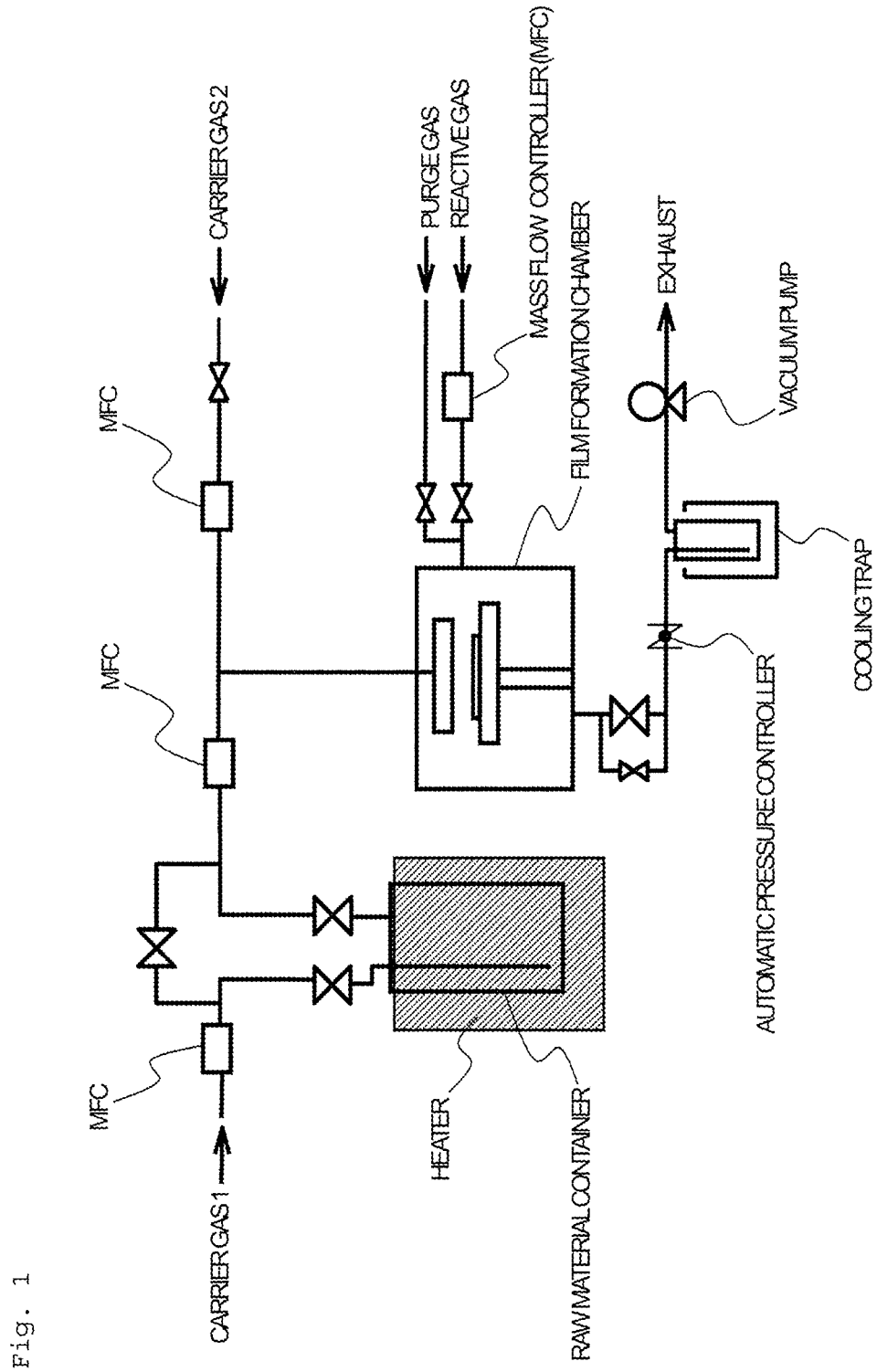
FIG. 1 is a schematic diagram for illustrating an example of an ALD apparatus to be used in a method of producing a thin-film according to the present invention.

A compound of the present invention is represented by the general formula (1) or (2) above. The compound of the present invention is suitable as a precursor in a method of producing a thin-film including a vaporization step such as an ALD method, which is one kind of CVD method.

In the general formula (1) above, $R^1$ to $R^4$ each independently represent a hydrogen atom, an alkyl group having 1 to 5 carbon atoms, or a group represented by the general formula (X-1), (X-2), or (X-3) above, $R^5$ and $R^6$ each independently represent a hydrogen atom or an alkyl group having 1 to 5 carbon atoms, $M^1$ represents a gallium atom or an indium atom, and part or all of hydrogen atoms in the alkyl group having 1 to 5 carbon atoms represented by each of $R^1$ to $R^6$ may each be substituted with a fluorine atom.

Examples of the alkyl group having 1 to 5 carbon atoms represented by each of $R^1$ to $R^6$ include a methyl group, an ethyl group, a propyl group, an isopropyl group, a butyl group, an isobutyl group, a sec-butyl group, a tert-butyl group, a pentyl group, an isopentyl group, and a neopentyl group.

Examples of a group obtained by substituting each of part or all of the hydrogen atoms in the alkyl group having 1 to 5 carbon atoms represented by each of $R^1$ to $R^6$ with a fluorine atom include a fluoro group, a monofluoromethyl group, a difluoromethyl group, a trifluoromethyl group, and a trifluoroethyl group.

In the group represented by the general formula (X-1), (X-2), or (X-3) above, $R^{21}$ to $R^{23}$ each independently represent an alkyl group having 1 to 5 carbon atoms, and * represents a bonding site.

Examples of the alkyl group having 1 to 5 carbon atoms represented by each of $R^{21}$ to $R^{23}$ include a methyl group, an ethyl group, a propyl group, an isopropyl group, a butyl group, an isobutyl group, a sec-butyl group, a tert-butyl group, a pentyl group, an isopentyl group, and a neopentyl group.

In the general formula (1) above, $R^1$ to $R^6$ are each appropriately selected in accordance with the applicable method of producing a thin-film. When the compound is used in a method of producing a thin-film including the step of vaporizing the compound, it is preferred to select $R^1$ to $R^6$ so that the compound has a large vapor pressure, a low melting point, and high thermal stability.

From the viewpoint that the vapor pressure of the compound increases, $R^1$ and $R^2$ each independently represent preferably an alkyl group having 1 to 3 carbon atoms or a group represented by the general formula (X-1), more preferably a methyl group or a dimethylamino group. Similarly, from the viewpoint that the vapor pressure of the compound increases, $R^3$ and $R^4$ each independently represent preferably an alkyl group having 1 to 3 carbon atoms, more preferably a methyl group. In addition, from the viewpoint that the melting point of the compound reduces, $R^5$ and $R^6$ each independently represent preferably an alkyl group having 1 to 5 carbon atoms, more preferably a primary alkyl group having 1 to 5 carbon atoms.

In addition, when the compound is used in a method of producing a thin-film by a MOD method free of any vaporization step, $R^1$ to $R^6$ may each be arbitrarily selected in accordance with, for example, solubility in a solvent to be used and a thin-film formation reaction.

In the general formula (2) above, $R^7$ to $R^{10}$ each independently represent a hydrogen atom, an alkyl group having 1 to 5 carbon atoms, or a group represented by the general formula (Y-1), (Y-2), or (Y-3) above, $R^{11}$ represents a hydrogen atom or an alkyl group having 1 to 5 carbon atoms, and $M^2$ represents a gallium atom or an indium atom, provided that when $R^7$ and $R^8$ each represent a methyl group, $R^{11}$ represents a hydrogen atom, a primary alkyl group having 1 to 5 carbon atoms, or a tertiary alkyl group having 4 or 5 carbon atoms, and part or all of hydrogen atoms in the alkyl group having 1 to 5 carbon atoms represented by each of $R^7$ to $R^{11}$ may each be substituted with a fluorine atom.

Examples of the alkyl group having 1 to 5 carbon atoms represented by each of $R^7$ to $R^{11}$ include a methyl group, an ethyl group, a propyl group, an isopropyl group, a butyl group, an isobutyl group, a sec-butyl group, a tert-butyl group, a pentyl group, an isopentyl group, and a neopentyl group.

Examples of a group obtained by substituting each of part or all of the hydrogen atoms in the alkyl group having 1 to 5 carbon atoms represented by each of $R^7$ to $R^{11}$ with a fluorine atom include a fluoro group, a monofluoromethyl group, a difluoromethyl group, a trifluoromethyl group, and a trifluoroethyl group.

In the group represented by the general formula (Y-1), (Y-2), or (Y-3) above, $R^{24}$ to $R^{26}$ each independently represent an alkyl group having 1 to 5 carbon atoms, and * represents a bonding site.

Examples of the alkyl group having 1 to 5 carbon atoms represented by each of $R^{24}$ to $R^{26}$ include a methyl group, an ethyl group, a propyl group, an isopropyl group, a butyl group, an isobutyl group, a sec-butyl group, a tert-butyl group, a pentyl group, an isopentyl group, and a neopentyl group.

In the general formula (2) above, $R^7$ to $R^{11}$ are each appropriately selected in accordance with the applicable method of producing a thin-film. When the compound is used in a method of producing a thin-film including the step of vaporizing the compound, it is preferred to select $R^7$ to $R^{11}$ so that the compound has a large vapor pressure, a low melting point, and high thermal stability.

From the viewpoint that the vapor pressure of the compound increases, $R^7$ and $R^8$ each independently represent preferably an alkyl group having 1 to 3 carbon atoms or a group represented by the general formula (Y-1), more preferably a methyl group or a dimethylamino group. Similarly, from the viewpoint that the vapor pressure of the compound increases, $R^9$ and $R^{10}$ each independently represent preferably an alkyl group having 1 to 3 carbon atoms, more preferably a methyl group. In addition, from the viewpoint that the melting point of the compound reduces, $R^{11}$ represents preferably an alkyl group having 1 to 5 carbon atoms, more preferably a primary alkyl group having 1 to 5 carbon atoms.

In addition, when the compound is used in a method of producing a thin-film by a MOD method free of any vaporization step, $R^7$ to $R^{11}$ may each be arbitrarily selected in accordance with, for example, solubility in a solvent to be used and a thin-film formation reaction.

The compound represented by the general formula (1) or (2) herein is a concept encompassing a compound represented by the following general formula (3) or (4).

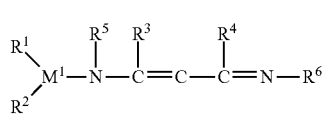

In the general formula (3), $R^1$ to $R^4$ each independently represent a hydrogen atom, an alkyl group having 1 to 5 carbon atoms, or a group represented by the general formula (X-1), (X-2), or (X-3), $R^5$ and $R^6$ each independently represent a hydrogen atom or an alkyl group having 1 to 5 carbon atoms, $M^1$ represents a gallium atom or an indium atom, and part or all of hydrogen atoms in the alkyl group having 1 to 5 carbon atoms represented by each of $R^1$ to $R^6$ may each be substituted with a fluorine atom.

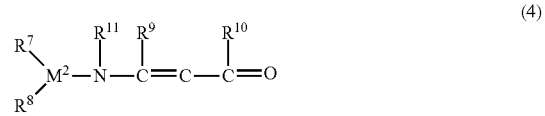

In the general formula (4), $R^7$ to $R^{10}$ each independently represent a hydrogen atom, an alkyl group having 1 to 5 carbon atoms, or a group represented by the general formula (Y-1), (Y-2), or (Y-3), $R^{11}$ represents a hydrogen atom or an alkyl group having 1 to 5 carbon atoms, and $M^2$ represents a gallium atom or an indium atom, provided that when $R^7$ and $R^8$ each represent a methyl group, $R^{11}$ represents a hydrogen atom, a primary alkyl group having 1 to 5 carbon atoms, or a tertiary alkyl group having 4 or 5 carbon atoms, and part or all of hydrogen atoms in the alkyl group having 1 to 5 carbon atoms represented by each of $R^7$ to $R^{11}$ may each be substituted with a fluorine atom.

Preferred specific examples of the compound represented by the general formula (1) include Compounds No. 1 to No. 144 below. In Compounds No. 1 to No. 144 below, "Me" represents a methyl group, "Et" represents an ethyl group, and "nPr" represents a n-propyl group.

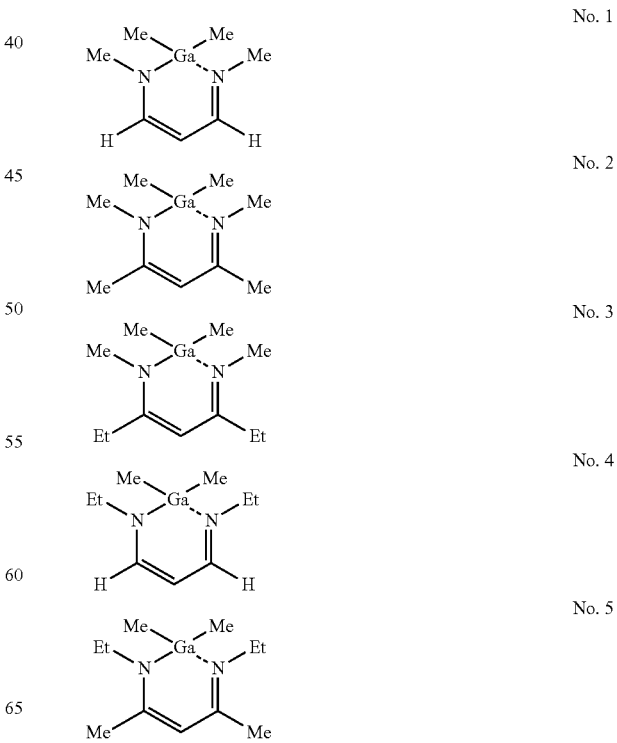

No. 6 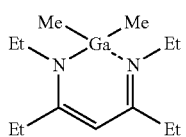
No. 7 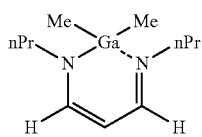
No. 8 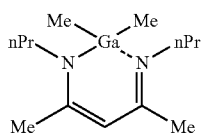
No. 9 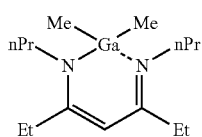
No. 10 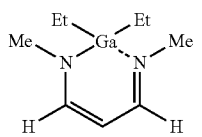
No. 11 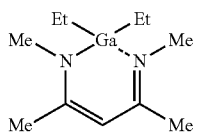
No. 12 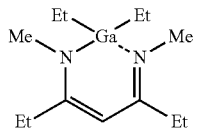
No. 13 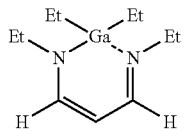
No. 14 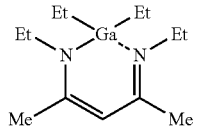
No. 15 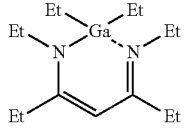
No. 16 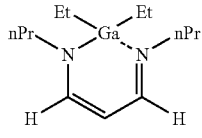
No. 17 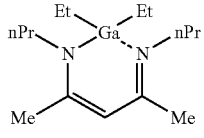
No. 18 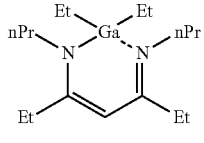
No. 19 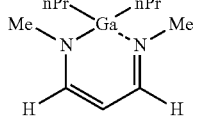
No. 20 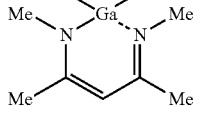
No. 21 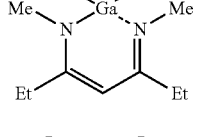
No. 22 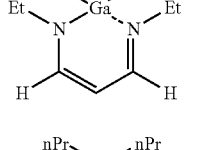
No. 23 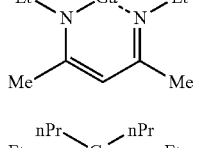
No. 24 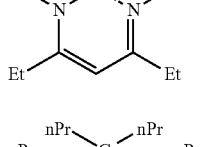
No. 25 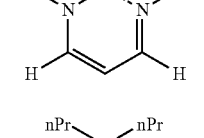
No. 26 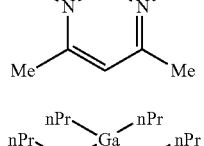
No. 27 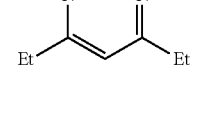

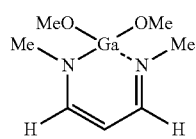 No. 28
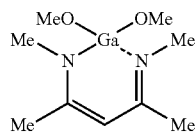 No. 29
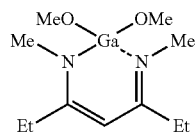 No. 30
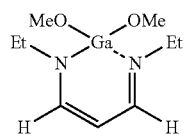 No. 31
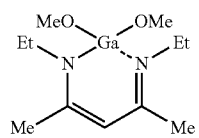 No. 32
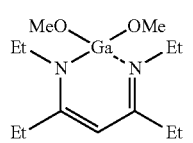 No. 33
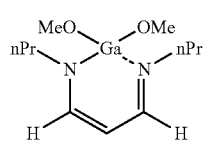 No. 34
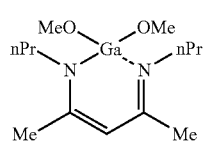 No. 35
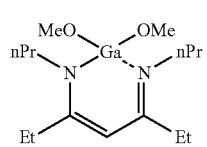 No. 36
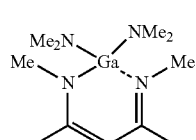 No. 37
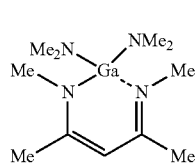 No. 38
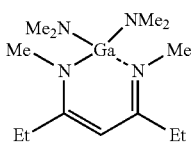 No. 39
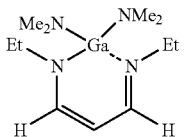 No. 40
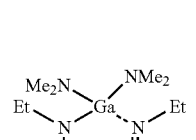 No. 41
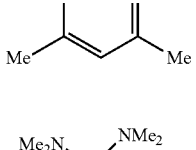 No. 42
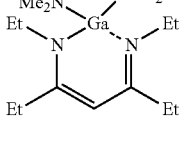 No. 43
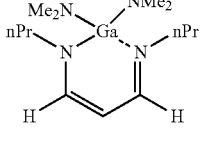 No. 44
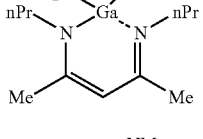 No. 45
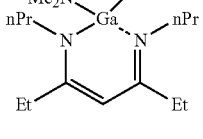 No. 46
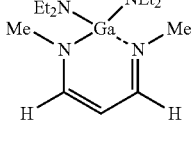 No. 47
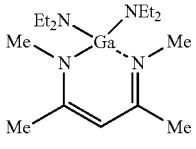 No. 48
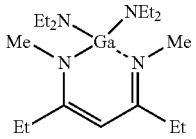

No. 49 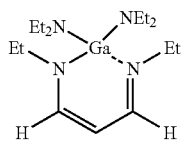
No. 50 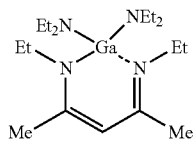
No. 51 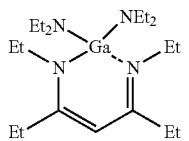
No. 52 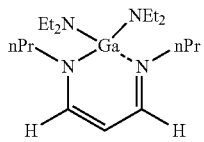
No. 53 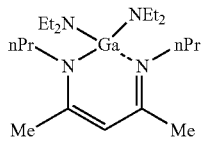
No. 54 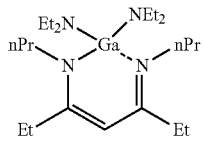
No. 55 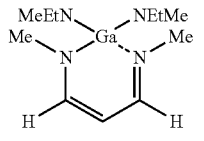
No. 56 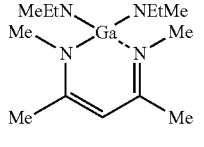
No. 57 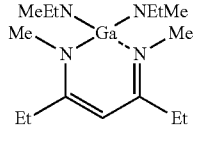
No. 58 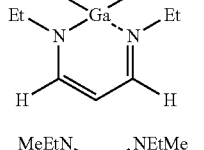
No. 59 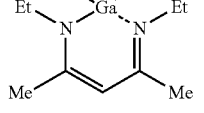
No. 60 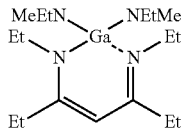
No. 61 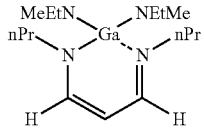
No. 62 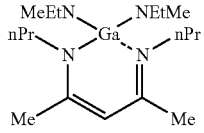
No. 63 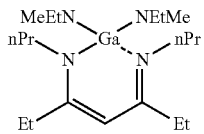
No. 64 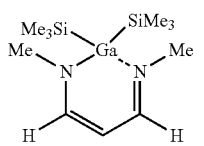
No. 65 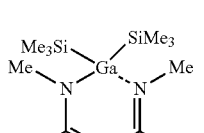
No. 66 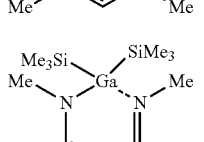
No. 67 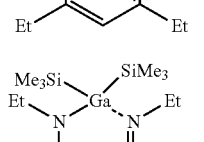
No. 68 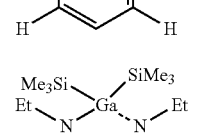
No. 69 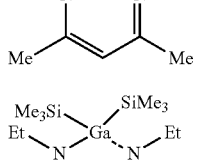
No. 70 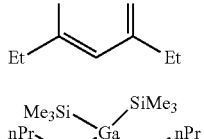
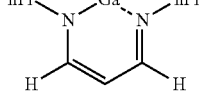

-continued
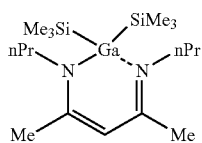
No. 71
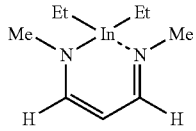
No. 82
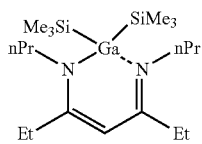
No. 72
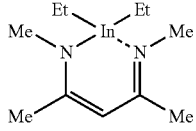
No. 83
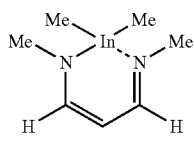
No. 73
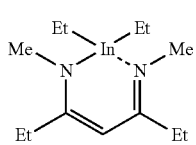
No. 84
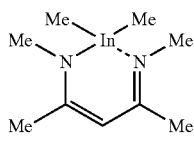
No. 74
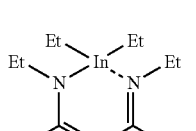
No. 85
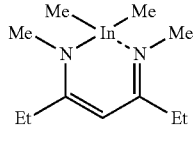
No. 75
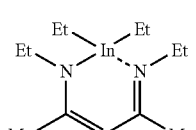
No. 86
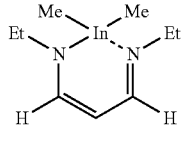
No. 76
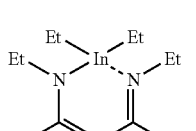
No. 87
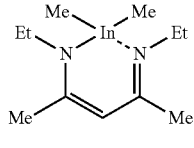
No. 77
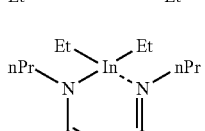
No. 88
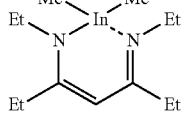
No. 78
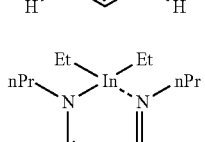
No. 89
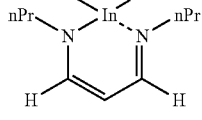
No. 79
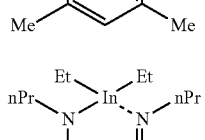
No. 90
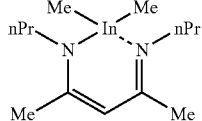
No. 80
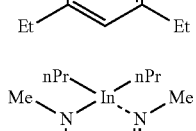
No. 91
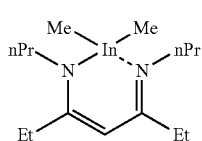
No. 81
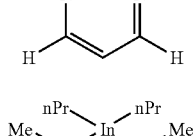
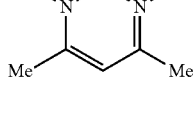
No. 92

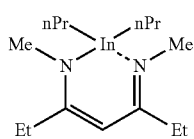
No. 93
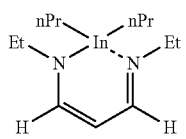
No. 94
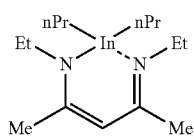
No. 95
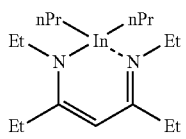
No. 96
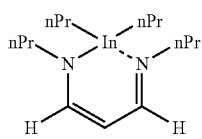
No. 97
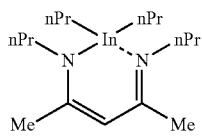
No. 98
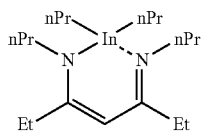
No. 99
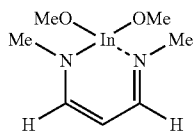
No. 100
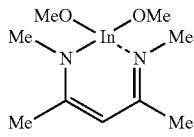
No. 101
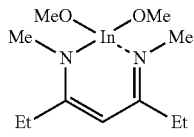
No. 102
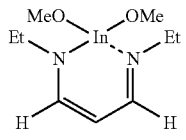
No. 103
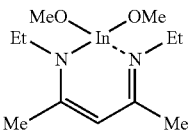
No. 104
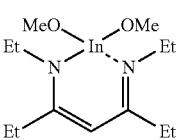
No. 105
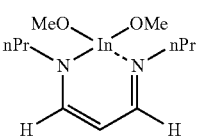
No. 106
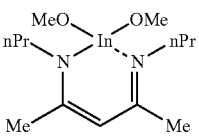
No. 107
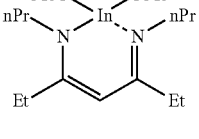
No. 108
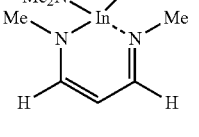
No. 109
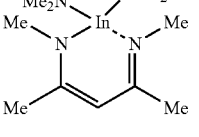
No. 110
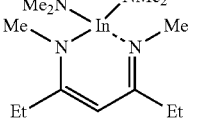
No. 111
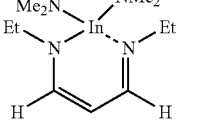
No. 112
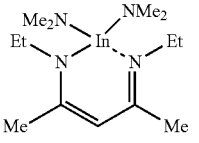
No. 113
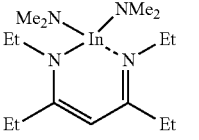
No. 114

-continued
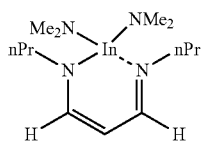 No. 115
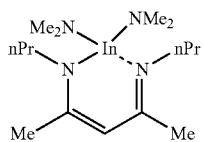 No. 116
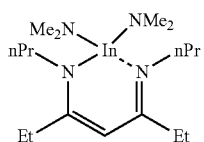 No. 117
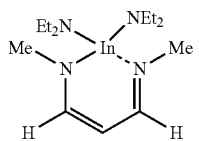 No. 118
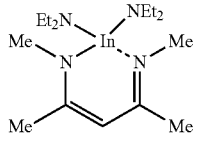 No. 119
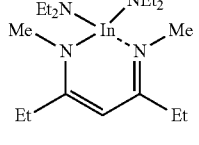 No. 120
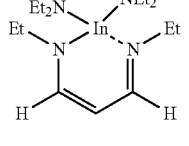 No. 121
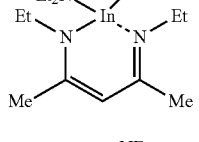 No. 122
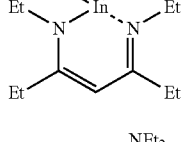 No. 123
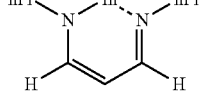 No. 124
-continued
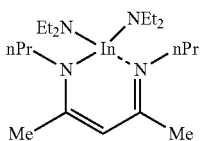 No. 125
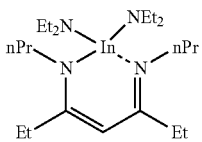 No. 126
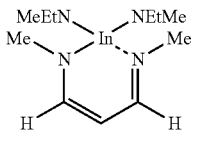 No. 127
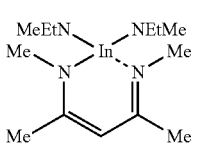 No. 128
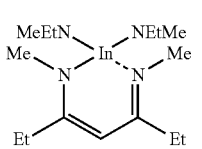 No. 129
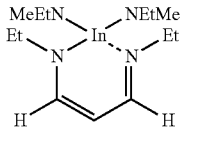 No. 130
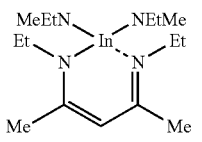 No. 131
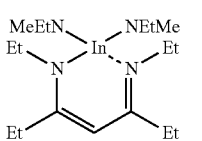 No. 132
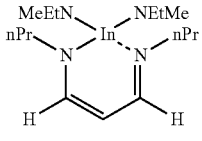 No. 133
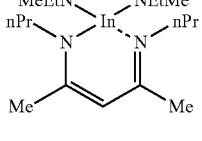 No. 134
No. 135

-continued

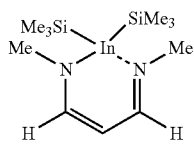
No. 136

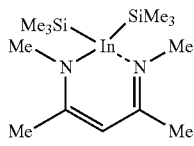
No. 137

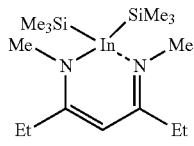
No. 138

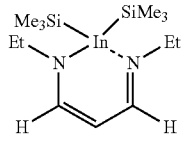
No. 139

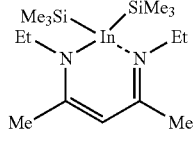
No. 140

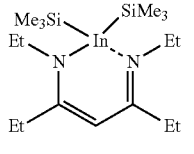
No. 141

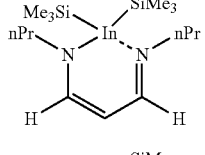
No. 142

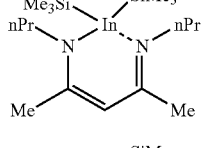
No. 143

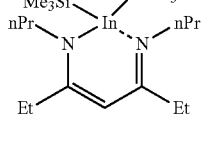
No. 144

A method of producing the compound represented by the general formula (1) is not particularly limited, and the compound is produced by applying a well-known reaction. The compound may be obtained, for example, as described below. A pentanediimine compound and an alkyllithium, lithium amide, a lithium alkoxide, or trimethylsilyllithium are caused to react with each other under a toluene solvent. After that, the resultant is further caused to react with gallium chloride or indium chloride to provide an intermediate. The resultant intermediate and an alkali lithium are caused to react with each other, and then the resultant is filtered. The solvent is distilled off from the filtrate, and then the resultant is purified through distillation.

Preferred specific examples of the compound represented by the general formula (2) include Compounds No. 145 to No. 288 below. In Compounds No. 145 to No. 288 below, "Me" represents a methyl group, "Et" represents an ethyl group, and "nPr" represents a n-propyl group.

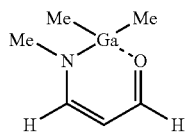
No. 145

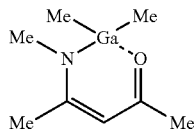
No. 146

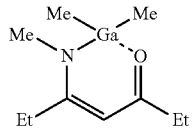
No. 147

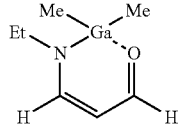
No. 148

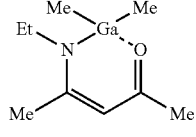
No. 149

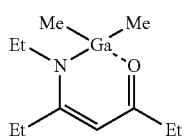
No. 150

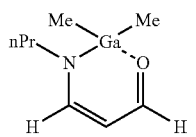
No. 151

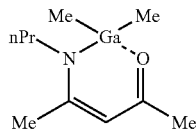
No. 152

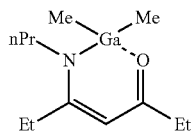
No. 153

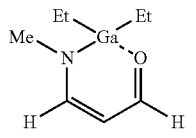
No. 154

-continued
No. 155 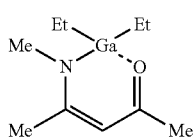
No. 156 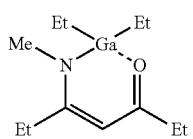
No. 157 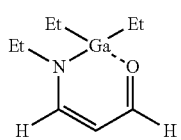
No. 158 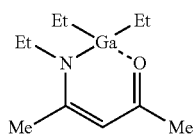
No. 159 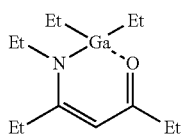
No. 160 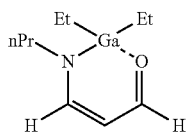
No. 161 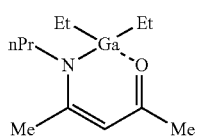
No. 162 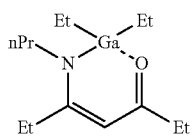
No. 163 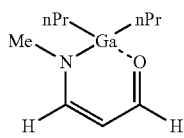
No. 164 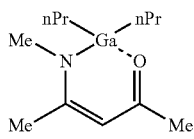
No. 165 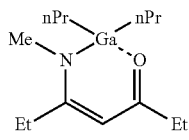
-continued
No. 166 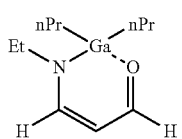
No. 167 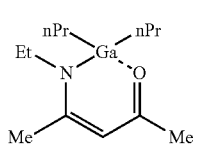
No. 168 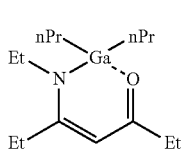
No. 169 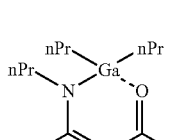
No. 170 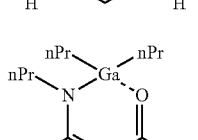
No. 171 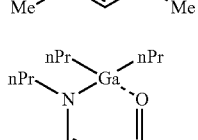
No. 172 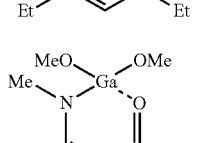
No. 173 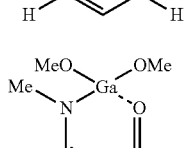
No. 174 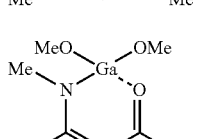
No. 175 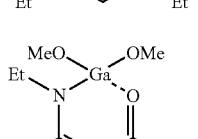
No. 176 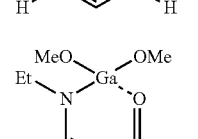

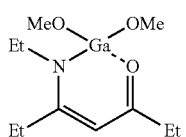 No. 177
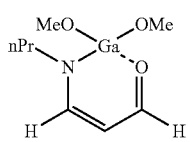 No. 178
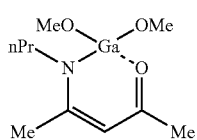 No. 179
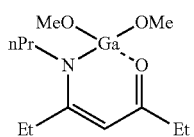 No. 180
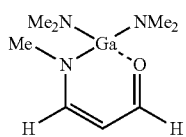 No. 181
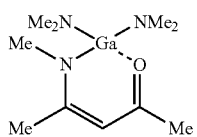 No. 182
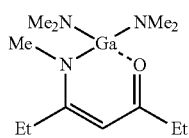 No. 183
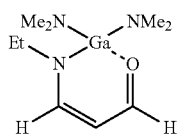 No. 184
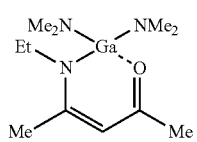 No. 185
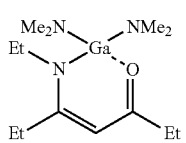 No. 186
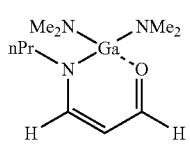 No. 187
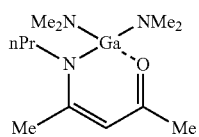 No. 188
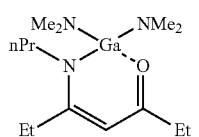 No. 189
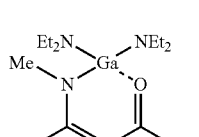 No. 190
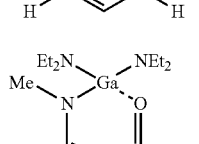 No. 191
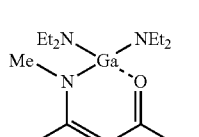 No. 192
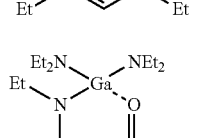 No. 193
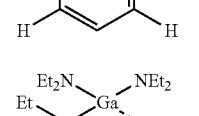 No. 194
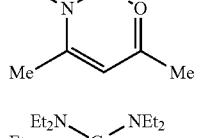 No. 195
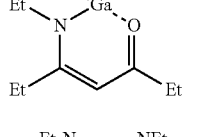 No. 196
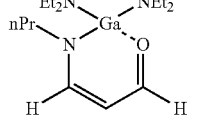 No. 197
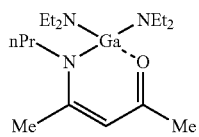 No. 198
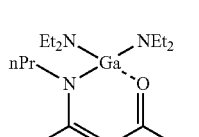

| | |
|---|---|
| 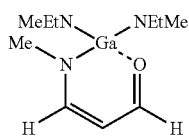 No. 199 | 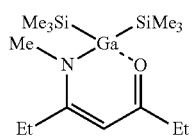 No. 210 |
| 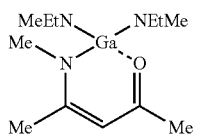 No. 200 | 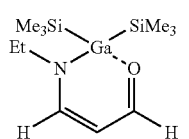 No. 211 |
| 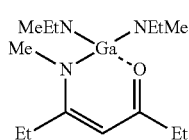 No. 201 | 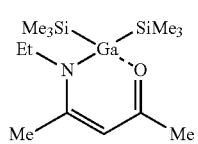 No. 212 |
| 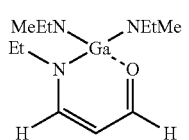 No. 202 | 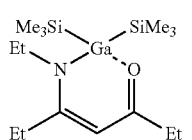 No. 213 |
| 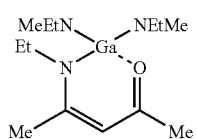 No. 203 | 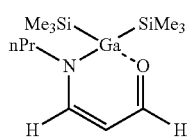 No. 214 |
| 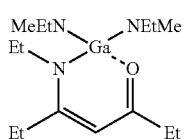 No. 204 | 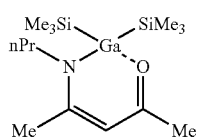 No. 215 |
| 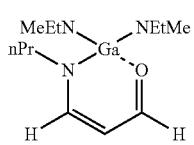 No. 205 | 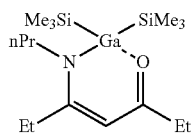 No. 216 |
| 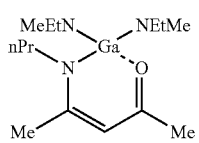 No. 206 | 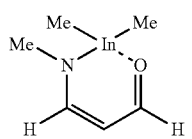 No. 217 |
| 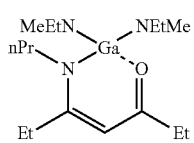 No. 207 | 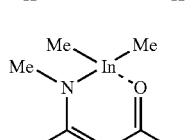 No. 218 |
| 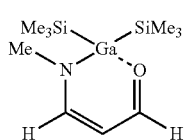 No. 208 | 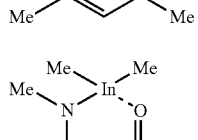 No. 219 |
| 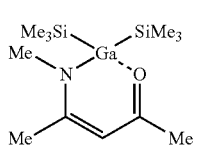 No. 209 | 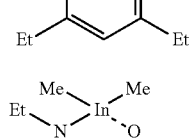 No. 220 |

-continued
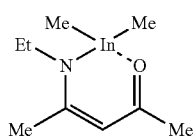  No. 221
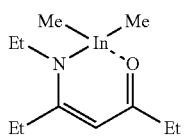  No. 222
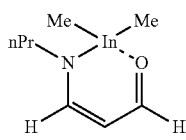  No. 223
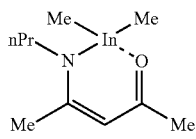  No. 224
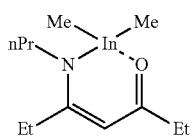  No. 225
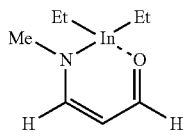  No. 226
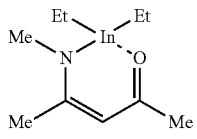  No. 227
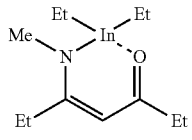  No. 228
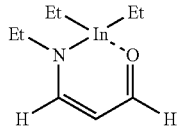  No. 229
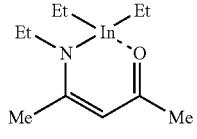  No. 230
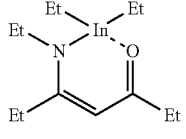  No. 231
-continued
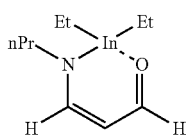  No. 232
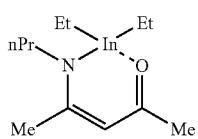  No. 233
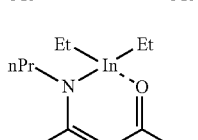  No. 234
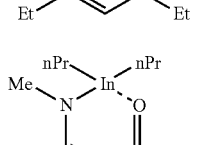  No. 235
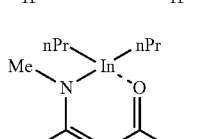  No. 236
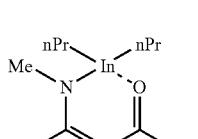  No. 237
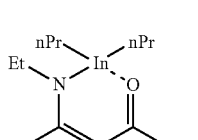  No. 238
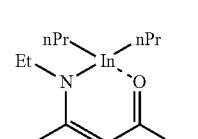  No. 239
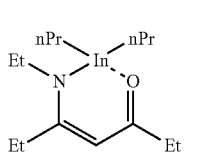  No. 240
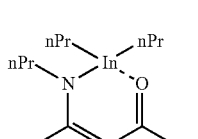  No. 241
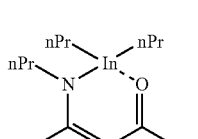  No. 242
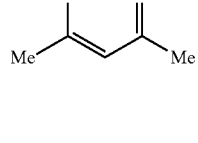

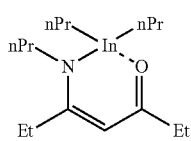
No. 243
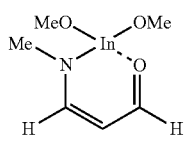
No. 244
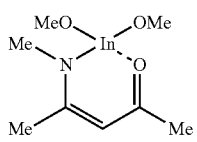
No. 245
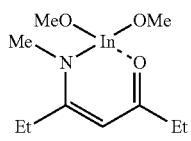
No. 246
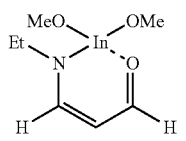
No. 247
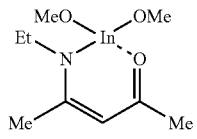
No. 248
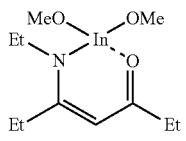
No. 249
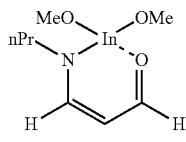
No. 250
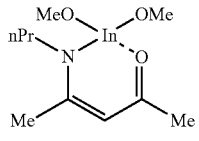
No. 251
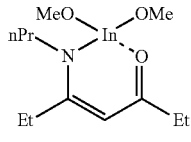
No. 252
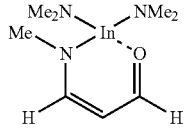
No. 253
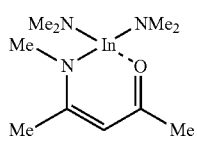
No. 254
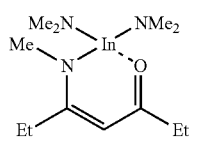
No. 255
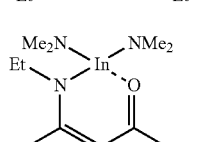
No. 256
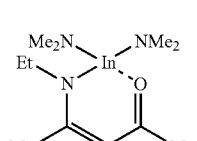
No. 257
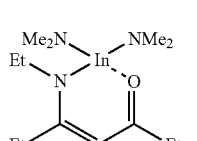
No. 258
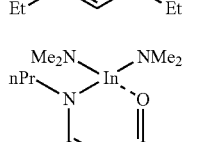
No. 259
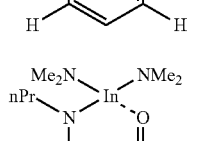
No. 260
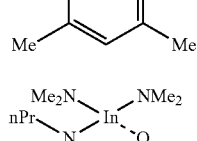
No. 261
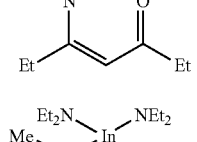
No. 262
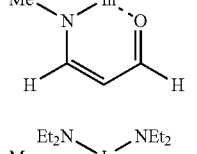
No. 263
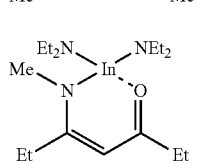
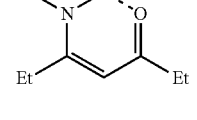
No. 264

-continued
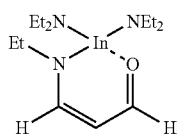 No. 265
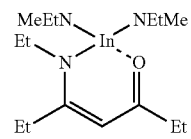 No. 276
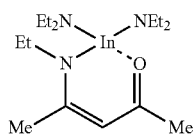 No. 266
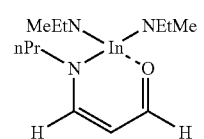 No. 277
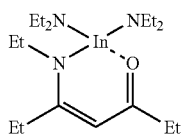 No. 267
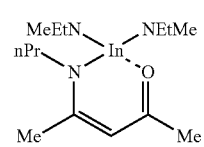 No. 278
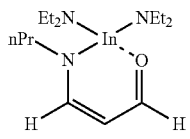 No. 268
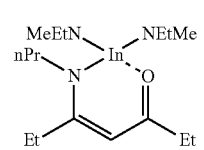 No. 279
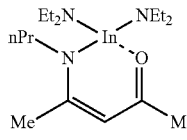 No. 269
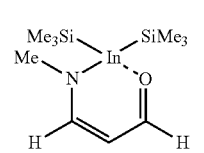 No. 280
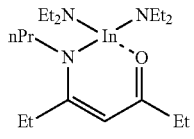 No. 270
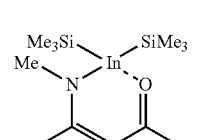 No. 281
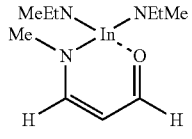 No. 271
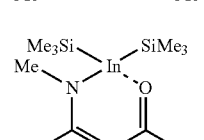 No. 282
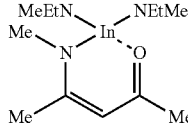 No. 272
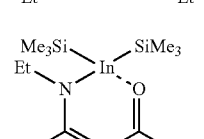 No. 283
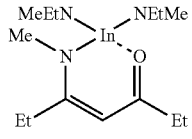 No. 273
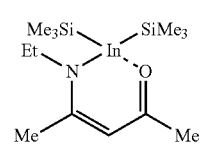 No. 284
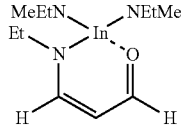 No. 274
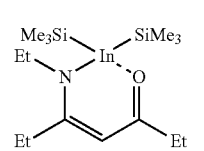 No. 285
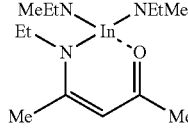 No. 275
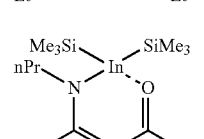 No. 286

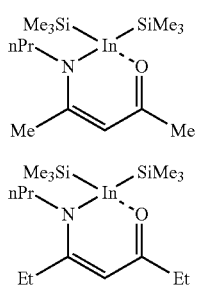

No. 287

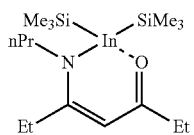

No. 288

A method of producing the compound represented by the general formula (2) is not particularly limited, and the compound is produced by applying a well-known reaction. The compound may be obtained, for example, as described below. An iminopentanone compound and an alkali lithium, lithium amide, a lithium alkoxide, or trimethylsilyllithium are caused to react with each other under a toluene solvent. After that, the resultant is further caused to react with gallium chloride or indium chloride to provide an intermediate. The resultant intermediate and an alkali lithium are caused to react with each other, and then the resultant is filtered. The solvent is distilled off from the filtrate, and then the resultant is purified through distillation. In addition, the compound may be obtained by: causing the iminopentanone compound and a trialkylgallium or a trialkylindium to react with each other under a toluene solvent; distilling off the solvent after the reaction; and purifying the resultant through distillation.

To secure transportability in the piping of an apparatus to be used at the time of the production of a thin-film, the melting point of the compound of the present invention is preferably less than 50° C., and the compound is more preferably a liquid at normal temperature.

Next, a thin-film forming raw material of the present invention is described. The thin-film forming raw material of the present invention includes the compound represented by the general formula (1) or (2) as a precursor of a thin-film. The form of the thin-film forming raw material varies depending on a production process in which the thin-film forming raw material is used. For example, when a thin-film containing only a gallium atom or an indium atom as a metal is produced, the thin-film forming raw material of the present invention is free of a metal compound other than the compound represented by the general formula (1) or (2) and a semimetal compound. Meanwhile, when a thin-film containing two or more kinds of metals and/or a semimetal is produced, the thin-film forming raw material of the present invention may include a compound containing a desired metal and/or a compound containing the semimetal (hereinafter sometimes referred to as "other precursor") in addition to the compound represented by the general formula (1) or (2). The thin-film forming raw material of the present invention may further contain an organic solvent and/or a nucleophilic reagent as described later. As described above, the physical properties of the compound represented by the general formula (1) or (2) serving as the precursor are suitable for a CVD method, and hence the thin-film forming raw material of the present invention is useful as a chemical vapor deposition raw material (hereinafter sometimes referred to as "CVD raw material"). The thin-film forming raw material of the present invention is particularly suitable for the ALD method out of the CVD methods because the compound represented by the general formula (1) or (2) has an ALD window.

When the thin-film forming raw material of the present invention is a chemical vapor deposition raw material, the form thereof is appropriately selected depending on a procedure, such as a transportation and supply method of the CVD method to be used.

As the above-mentioned transportation and supply method, there are given a gas transportation method and a liquid transportation method. The gas transportation method involves heating and/or decompressing the CVD raw material in a container in which the raw material is stored (hereinafter sometimes referred to as "raw material container"), to thereby vaporize the raw material to obtain a raw material gas, and introducing the raw material gas into a film formation chamber (hereinafter sometimes referred to as "deposition reaction portion") having a substrate set therein together with a carrier gas, such as argon, nitrogen, or helium, to be used as required. The liquid transportation method involves transporting the CVD raw material to a vaporization chamber under the state of a liquid or a solution, heating and/or decompressing the raw material in the vaporization chamber, to thereby vaporize the raw material to obtain a raw material gas, and introducing the raw material gas into the film formation chamber. In the case of the gas transportation method, the compound represented by the general formula (1) or (2) itself may be used as the CVD raw material. In the case of the liquid transportation method, the compound represented by the general formula (1) or (2) itself or a solution obtained by dissolving the compound in an organic solvent may be used as the CVD raw material. Any such CVD raw material may further contain the other precursor, a nucleophilic reagent, and the like.

In addition, in a multi-component CVD method, there are given a method involving vaporizing and supplying the CVD raw material independently for each component (hereinafter sometimes referred to as "single source method"), and a method involving vaporizing and supplying a mixed raw material obtained by mixing a multi-component raw material with desired composition in advance (hereinafter sometimes referred to as "cocktail source method"). In the case of the cocktail source method, a mixture of the compound represented by the general formula (1) or (2) and the other precursor or a mixed solution obtained by dissolving the mixture in an organic solvent may be used as the CVD raw material. The mixture or the mixed solution may further contain a nucleophilic reagent and the like.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, a relationship among the use temperature, boiling point, and flash point of each of the solvents, and the like.

When the thin-film forming raw material of the present invention is a mixed solution with the above-mentioned organic solvent, the amount of the entire precursors in the thin-film forming raw material is preferably from 0.01 mol/liter to 2.0 mol/liter, more preferably from 0.05 mol/liter to 1.0 mol/liter.

When the thin-film forming raw material of the present invention is free of a metal compound other than the compound represented by the general formula (1) or (2) and a semimetal compound, the amount of the entire precursors herein means the amount of the compound represented by the general formula (1) or (2). When the thin-film forming raw material of the present invention includes a compound containing another metal and/or a compound containing a semimetal (other precursor) in addition to the compound represented by the general formula (1) or (2), the amount of the entire precursors herein means the total amount of the compound represented by the general formula (1) or (2) and the other precursor.

In addition, in the case of the multi-component CVD method, there is no particular limitation on the other precursor to be used together with the compound represented by the general formula (1) or (2), and a well-known general precursor used in the CVD raw material may be used.

Examples of the other precursor include compounds of one kind or two or more kinds selected from the group consisting of compounds used as organic ligands, such as an alcohol compound, a glycol compound, a β-diketone compound, a cyclopentadiene compound, and an organic amine compound, and silicon or a metal. In addition, examples of the kind of the metal in the precursor include lithium, sodium, potassium, magnesium, calcium, strontium, barium, titanium, zirconium, hafnium, vanadium, tantalum, chromium, molybdenum, tungsten, manganese, iron, cobalt, rhodium, iridium, nickel, palladium, platinum, copper, silver, gold, zinc, aluminum, germanium, tin, lead, antimony, bismuth, yttrium, lanthanum, cerium, praseodymium, neodymium, promethium, samarium, europium, gadolinium, terbium, dysprosium, holmium, erbium, thulium, ytterbium, ruthenium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound to be used as the organic ligand in the above-mentioned other precursor include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene.

Examples of the organic amine compound to be used as the organic ligand in the above-mentioned other precursor include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

In the case of the single source method, a compound similar to the compound represented by the general formula (1) or (2) in the behavior of thermal decomposition and/or oxidative decomposition is preferably used as the above-mentioned other precursor. In the case of the cocktail source method, a compound that not only is similar to the compound represented by the general formula (1) or (2) in the behavior of thermal decomposition and/or oxidative decomposition but also does not cause any change impairing desired characteristics as a precursor through a chemical reaction or the like at the time of mixing is preferably used as the above-mentioned other precursor.

In addition, the thin-film forming raw material of the present invention may contain a nucleophilic reagent as required in order to impart stability to the compound represented by the general formula (1) or (2) and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents is preferably from 0.1 mol to 10 mol, more preferably from 1 mol to 4 mol with respect to 1 mol of the amount of the entire precursors.

The thin-film forming raw material of the present invention is prevented from containing impurity metal elements other than the components forming the raw material, impurity halogens, such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, most preferably 1 ppm or less. The total content of the impurity organic substances is preferably 500 ppm or less, more preferably 50 ppm or less, most preferably 10 ppm or less. In addition, moisture causes generation of particles in the chemical vapor deposition raw material and generation of particles during thin-film formation. Accordingly, moisture in each of the precursor, the organic solvent, and the nucleophilic reagent is preferably removed as much as possible before its use. The moisture content of each of the precursor, the organic solvent, and the nucleophilic reagent is preferably 10 ppm or less, more preferably 1 ppm or less.

In addition, it is preferred that the thin-film forming raw material of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 mL of the liquid phase, it is more preferred that the number of particles larger than 0.2 μm be 1,000 or less in 1 mL of the liquid phase, and it is most preferred that the number of particles larger than 0.2 μm be 100 or less in 1 mL of the liquid phase.

Next, a method of producing a thin-film including using the thin-film forming raw material of the present invention is described. A method of producing a thin-film of the present invention in which the thin-film is produced by using the thin-film forming raw material of the present invention is a CVD method including: introducing a raw material gas obtained by vaporizing the thin-film forming raw material of the present invention and a reactive gas to be used as required into a film formation chamber (treatment atmosphere) having a substrate set therein; and then subjecting the precursor in the raw material gas to decomposition and/or a chemical reaction on the substrate, to thereby grow and deposit the thin-film containing a gallium atom or an indium atom on the surface of the substrate. There are no particular limitations on a transportation and supply method for the raw material, a deposition method therefor, production conditions, a production apparatus, and the like, and well-known general conditions and methods may be used.

Examples of the above-mentioned reactive gas to be used as required include: reducing gases such as hydrogen; oxidizing gases, such as oxygen, ozone, and water vapor; and nitriding gases, such as organic amine compounds including a monoalkylamine, a dialkylamine, a trialkylamine, and an alkylenediamine, hydrazine, and ammonia. Those reactive gases may be used alone or in combination thereof. The compound represented by the general formula (1) or (2) has such a property as to react with ammonia or ozone in a particularly satisfactory manner. Accordingly, ammonia or ozone is preferably used as the reactive gas.

In addition, examples of the above-mentioned transportation and supply method include the gas transportation method, the liquid transportation method, the single source method, and the cocktail source method described above.

In addition, examples of the above-mentioned deposition method include: thermal CVD including causing a raw material gas, or the raw material gas and a reactive gas, to react only with heat, to thereby deposit a thin-film; plasma CVD using heat and plasma; optical CVD using heat and light; optical plasma CVD using heat, light, and plasma; and ALD including dividing a deposition reaction of CVD into elementary steps, and performing deposition at a molecular level in a stepwise manner.

As a material for the substrate, there are given, for example: silicon; ceramics, such as silicon nitride, titanium nitride, tantalum nitride, titanium oxide, titanium nitride, ruthenium oxide, zirconium oxide, hafnium oxide, and lanthanum oxide; glass; and metals such as metal cobalt. The shape of the substrate is, for example, a plate shape, a spherical shape, a fibrous shape, or a scaly shape. The surface of the substrate may be planar, or may have a three-dimensional structure such as a trench structure.

In addition, examples of the above-mentioned production conditions include a reaction temperature (substrate temperature), a reaction pressure, and a deposition rate. The reaction temperature is preferably not less than 100° C. that is the temperature at which the compound of the present invention sufficiently reacts, more preferably from 150° C. to 400° C., particularly preferably from 200° C. to 350° C. In addition, the reaction pressure is preferably from 10 Pa to an atmospheric pressure in the case of the thermal CVD or the optical CVD, and is preferably from 10 Pa to 2,000 Pa in the case of using plasma.

In addition, the deposition rate may be controlled by the supply conditions (vaporization temperature and vaporization pressure) of the raw material, the reaction temperature, and the reaction pressure. When the deposition rate is large, the characteristics of a thin-film to be obtained may deteriorate. When the deposition rate is small, a problem may occur in productivity. Accordingly, the deposition rate is preferably from 0.01 nm/min to 100 nm/min, more preferably from 1 nm/min to 50 nm/min. In addition, in the case of the ALD method, the deposition rate is controlled by the number of cycles so that a desired film thickness may be obtained.

Further, as the above-mentioned production conditions, there are given a temperature and a pressure when the thin-film forming raw material is vaporized to obtain a raw material gas. The step of vaporizing the thin-film forming raw material to obtain a raw material gas may be performed in the raw material container or in the vaporization chamber. In any case, it is preferred that the thin-film forming raw material of the present invention be evaporated at a temperature of from 0° C. to 150° C. In addition, when the thin-film forming raw material is vaporized to obtain a raw material gas in the raw material container or in the vaporization chamber, the pressure in the raw material container and the pressure in the vaporization chamber are both preferably from 1 Pa to 10,000 Pa.

When the ALD method is adopted, the method of producing a thin-film of the present invention may include, in addition to a raw material introduction step of vaporizing the thin-film forming raw material by the above-mentioned transportation and supply method to provide a raw material gas, followed by the introduction of the raw material gas into the film formation chamber, a precursor thin-film formation step of forming a precursor thin-film from the above-mentioned compound in the raw material gas on the surface of the above-mentioned substrate, an evacuation step of evacuating an unreacted compound gas, and a metal-containing thin-film formation step of causing the precursor thin-film to chemically react with the reactive gas, to thereby form a thin-film containing a metal on the surface of the substrate.

Now, regarding each step of the ALD method, the case of forming a metal thin-film is described in detail as an example. First, the above-mentioned raw material introduction step is performed. The preferred temperature and pressure when the thin-film forming raw material is turned into a raw material gas are the same as those described in the method of producing a thin-film by the CVD method. Next, the raw material gas introduced into the film formation chamber and the surface of the substrate are brought into contact with each other, and hence the precursor thin-film is formed on the surface of the substrate (precursor thin-film formation step). In this case, heat may be applied by heating the substrate or heating the film formation chamber. The precursor thin-film formed in this step is a thin-film produced from the compound represented by the general formula (1) or (2) or a thin-film produced by the decomposition and/or reaction of part of the compound represented by the general formula (1) or (2), and hence has composition different from that of the target metal nitride thin-film. The temperature of the substrate when this step is performed is preferably from room temperature to 500° C., more preferably from 150° C. to 350° C. The pressure of a system (in the film formation chamber) when this step is performed is preferably from 1 Pa to 10,000 Pa, more preferably from 10 Pa to 1,000 Pa.

Next, the unreacted compound gas and a gas generated as a by-product are evacuated from the film formation chamber (evacuation step). It is ideal that the unreacted compound gas and the gas generated as a by-product be completely evacuated from the film formation chamber, but it is not always required that the gases be completely evacuated. As an evacuation method, there are given, for example: a method including purging the inside of the system with an inert gas, such as nitrogen, helium, or argon; a method including performing evacuation by decompressing the inside of the system; and a combination of these methods. The degree of decompression when the decompression is performed is preferably from 0.01 Pa to 300 Pa, more preferably from 0.01 Pa to 100 Pa.

Next, a nitriding gas is introduced as the reactive gas into the film formation chamber, and the metal thin-film is formed from the precursor thin-film obtained in the previous precursor thin-film formation step through the action of the nitriding gas or the action of the nitriding gas and heat (metal-containing thin-film formation step). In this step, the temperature when the heat is applied is preferably from room temperature to 500° C., more preferably from 150° C. to 350° C. The pressure of the system (in the film formation chamber) when this step is performed is preferably from 1 Pa to 10,000 Pa, more preferably from 10 Pa to 1,000 Pa. The compound represented by the general formula (1) or (2) has satisfactory reactivity with the nitriding gas, and hence a high-quality metal thin-film containing less residual carbon can be obtained.

When the ALD method is adopted in the method of producing a thin-film of the present invention as described above, thin-film deposition performed by a series of operations including the above-mentioned raw material introduction step, precursor thin-film formation step, evacuation step, and metal-containing thin-film formation step is defined as one cycle, and this cycle may be repeated a plurality of times until a thin-film having a required film thickness is obtained. In this case, it is preferred that, after one cycle is performed, a compound gas and a reactive gas that are unreacted, and a gas generated as a by-product be evacuated from the deposition reaction portion in the same manner as in the above-mentioned evacuation step, and then the subsequent one cycle be performed.

In addition, in the formation of the metal thin-film by the ALD method, energy, such as plasma, light, or a voltage, may be applied, and a catalyst may be used. There are no particular limitations on the timing for applying the energy and the timing for using the catalyst. The energy may be applied or the catalyst may be used, for example, at the time of introducing the compound gas in the raw material introduction step, at the time of heating in the precursor thin-film formation step or the metal-containing thin-film formation step, at the time of evacuating the inside of the system in the evacuation step, or at the time of introducing the reducing gas in the metal-containing thin-film formation step, or between the above-mentioned respective steps.

In addition, in the method of producing a thin-film of the present invention, after the thin-film deposition, annealing treatment may be performed in an inert atmosphere, an oxidizing atmosphere, or a reducing atmosphere in order to obtain more satisfactory electrical characteristics. When step embedding is required, a reflow step may be provided. The temperature in this case is from 200° C. to 1,000° C., preferably from 250° C. to 500° C.

Figure 2:
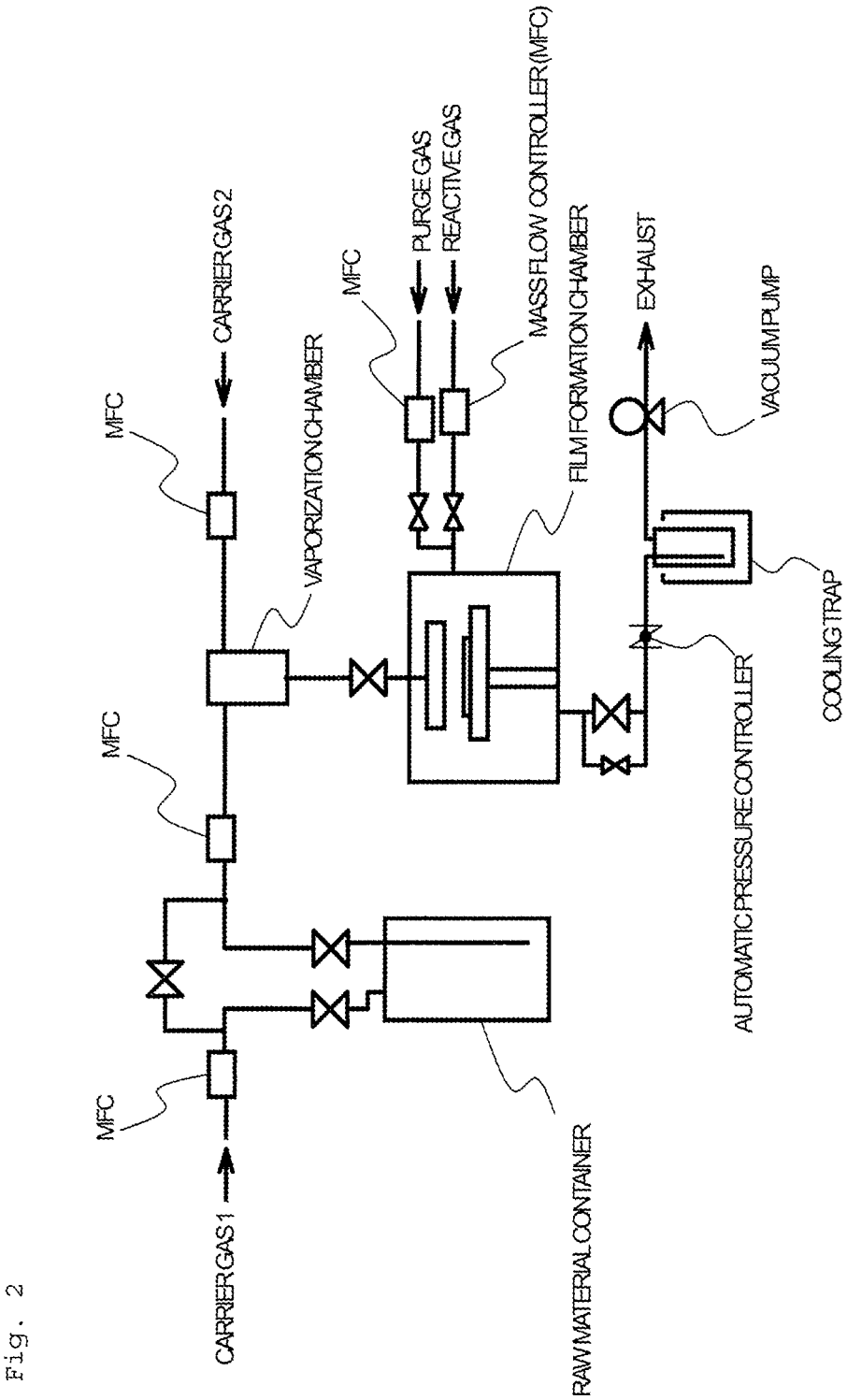
FIG. 2 is a schematic diagram for illustrating another example of the ALD apparatus to be used in the method of producing a thin-film according to the present invention.
Figure 3:
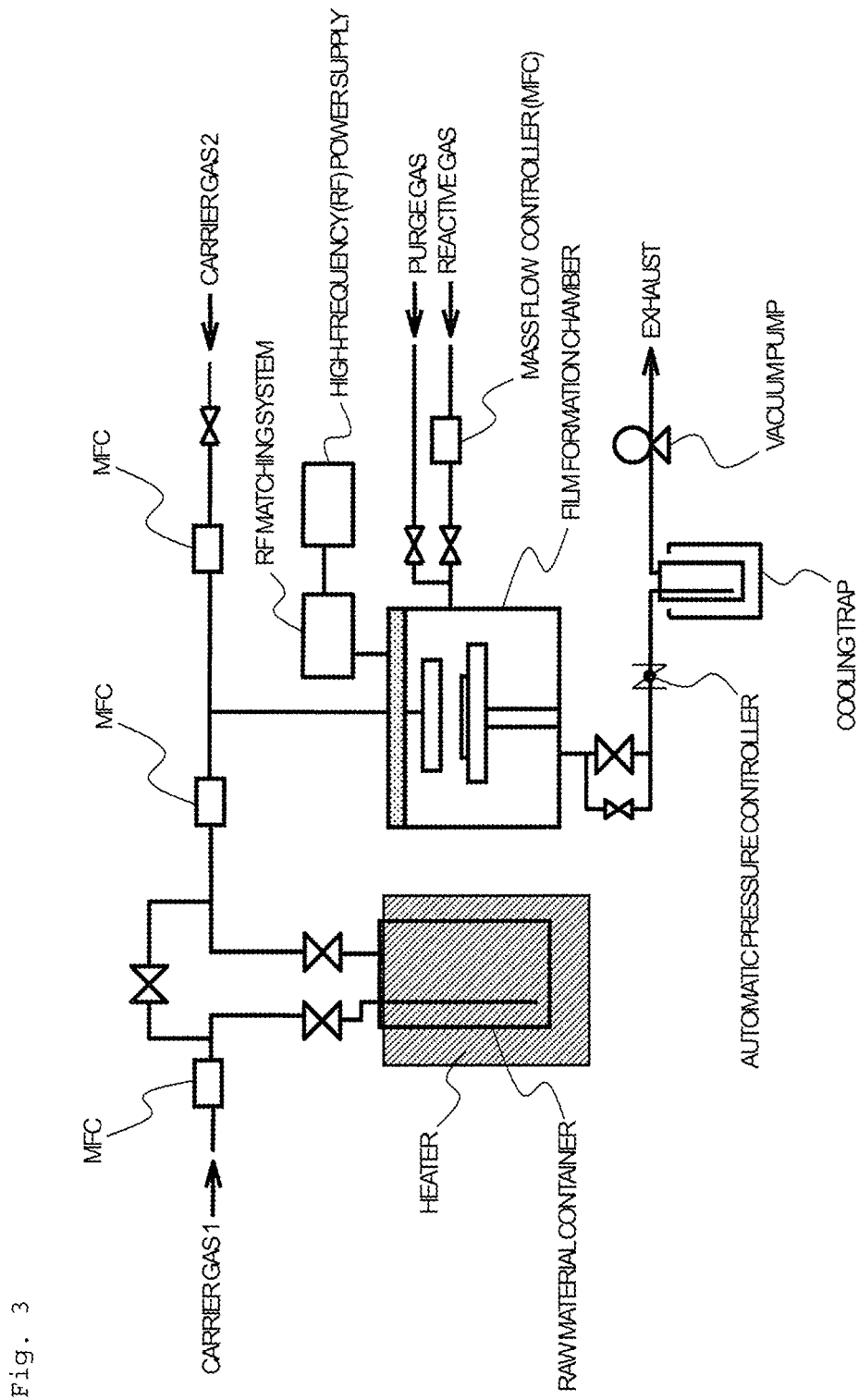
FIG. 3 is a schematic diagram for illustrating still another example of the ALD apparatus to be used in the method of producing a thin-film according to the present invention.
Figure 4:
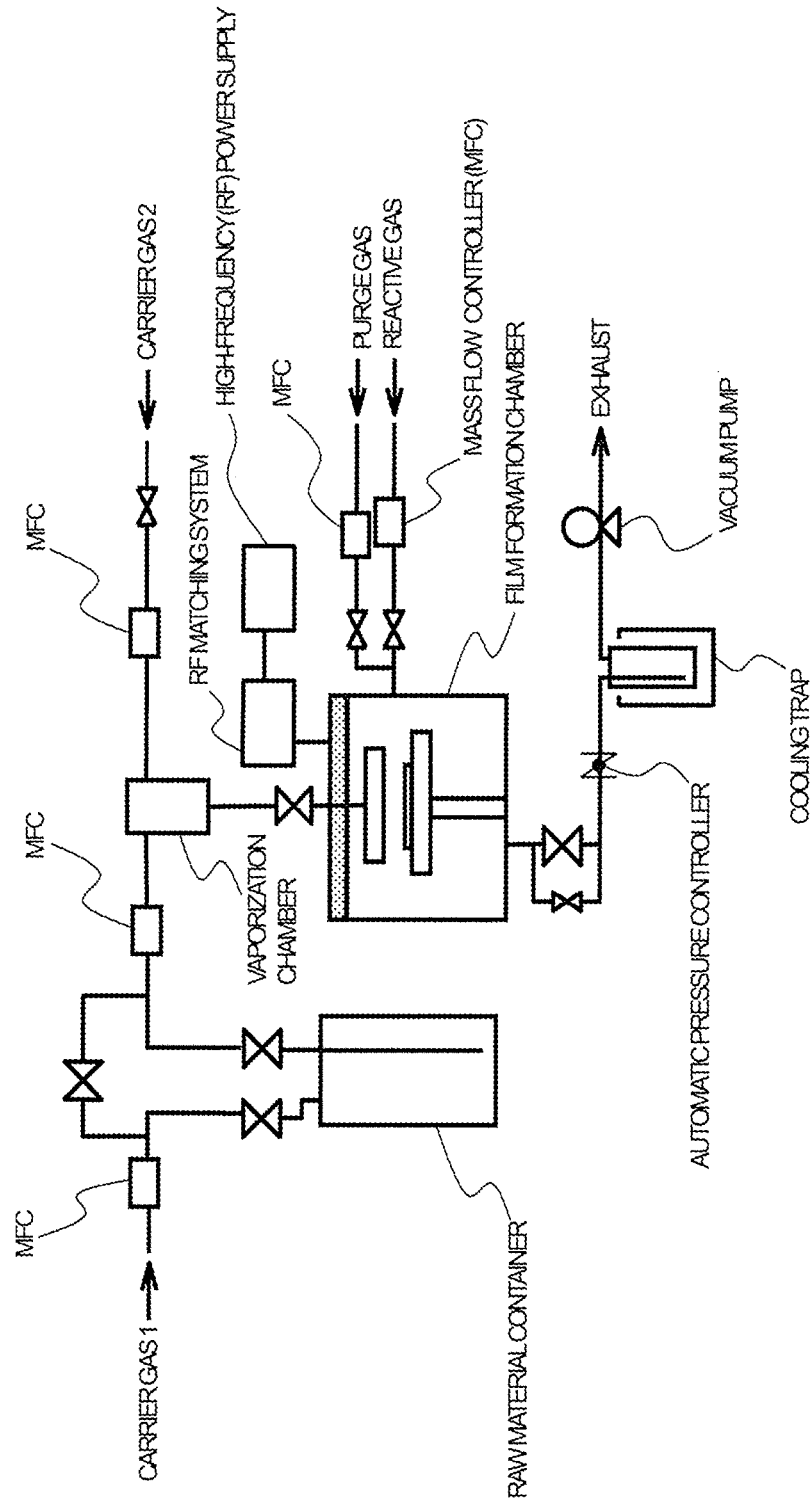
FIG. 4 is a schematic diagram for illustrating yet still another example of the ALD apparatus to be used in the method of producing a thin-film according to the present invention.

A well-known ALD apparatus may be used in the method of producing a thin-film of the present invention. Specific examples of the ALD apparatus include an apparatus capable of performing bubbling supply of a precursor as illustrated in FIG. 1 and FIG. 3 and an apparatus including a vaporization chamber as illustrated in FIG. 2 and FIG. 4. Another specific example thereof is an apparatus capable of subjecting the reactive gas to plasma treatment as illustrated in FIG. 3 and FIG. 4. The apparatus is not limited to such single-substrate type apparatus each including a film formation chamber (hereinafter referred to as "deposition reaction portion") as illustrated in FIG. 1 to FIG. 4, and an apparatus capable of simultaneously processing a large number of substrates through use of a batch furnace may also be used. Those apparatus may also be used as CVD apparatus.

A thin-film produced through use of the thin-film forming raw material of the present invention may be formed as desired kinds of thin-films, such as thin-films of a metal, oxide ceramics, nitride ceramics, and glass, by appropriately selecting the other precursor, the reactive gas, and the production conditions. It has been known that the thin-films exhibit electrical characteristics, optical characteristics, and the like, and the thin-films have been applied to various usages. Examples thereof include a metal gallium thin-film, a metal indium thin-film, a gallium oxide thin-film, an indium oxide thin-film, a gallium nitride thin-film, an indium nitride thin-film, a gallium alloy, an indium alloy, a gallium-containing composite oxide thin-film, and an indium-containing composite oxide thin-film. Examples of the gallium alloy include a Ga—Fe alloy, a Ga—Sn alloy, a Ga—Zn alloy, and a Ga—In alloy. Examples of the indium alloy include an In—Sn alloy, an In—Zn alloy, an In—P alloy, and an In—Ga alloy. Those thin-films have been widely used in the production of, for example, an electrode material for a memory element typified by a DRAM element, a resistance film, a diamagnetic film used for the recording layer of a hard disk, and a catalyst material for a polymer electrolyte fuel cell.

EXAMPLES

The present invention is described in more detail below by way of Examples, Comparative Examples, and Evaluation Examples. However, the present invention is by no means limited by Examples and the like below.
<Production of Gallium Compounds>
The production results of gallium compounds are described in Examples 1 to 4 below.

[Example 1] Production of Compound No. 5

Under an Ar atmosphere, 5.70 g (0.037 mol) of N,N-diethyl-2,4-pentanediimine and 50 mL of dehydrated toluene were added to a 100 mL two-necked flask, and the mixture was cooled to −20° C. 24 mL of a n-hexane solution containing n-butyllithium (n-butyllithium content: 1.58 mol/L) was dropped into the mixture, and the temperature of the whole was increased to room temperature, followed by stirring for 2 hours. 6.51 g (0.037 mol) of gallium chloride and 70 mL of dehydrated toluene were added to a 200 mL four-necked flask that had been separately prepared, and the mixture was cooled to −20° C. The solution prepared in advance was dropped into the mixture, and the temperature of the whole was increased to room temperature, followed by stirring for 18 hours. The reaction solution was filtered, and the solvent was distilled off under slightly reduced pressure, followed by distillation under reduced pressure. Thus, 6.81 g of Intermediate 1 was obtained. 6.81 g (0.023 mol) of Intermediate 1 and 50 mL of dehydrated toluene were added to a 100 mL two-necked flask, and the mixture was cooled to −20° C. 40 mL of a diethyl ether solution containing methyllithium (methyllithium content: 1.17 mol/L) was dropped into the mixture, and the temperature of the whole was increased to room temperature, followed by stirring for 18 hours. The reaction solution was filtered, and the solvent was distilled off under slightly reduced pressure, followed by distillation under reduced pressure. Thus, 2.75 g of a target product that was a pale yellow liquid was obtained (yield: 47%).

(Analytic Values)
(1) $^1$H-NMR (Solvent: Deuterated Benzene) (Chemical Shift:Multiplicity:Number of Hs)
(−0.02:s:6), (0.95:t:6), (1.57:s:6), (3.03:q:4), (4.29:s:1)
(2) Elemental Analysis (Metal Analysis: ICP-AES)
Ga: 27.7 mass %, C: 52.8 mass %, H: 8.7 mass %, N: 10.8 mass %
(theoretical values; Ga: 27.56 mass %, C: 52.21 mass %, H: 9.16 mass %, N: 11.07 mass %)

[Example 2] Production of Compound No. 8

Under an Ar atmosphere, 10.4 g (0.057 mol) of N,N-dipropyl-2,4-pentanediimine and 90 mL of dehydrated toluene were added to a 200 mL four-necked flask, and the mixture was cooled to −20° C. 36 mL of a n-hexane solution containing n-butyllithium (n-butyllithium content: 1.58 mol/L) was dropped into the mixture, and the temperature of the whole was increased to room temperature, followed by stirring for 2 hours. 10.0 g (0.057 mol) of gallium chloride and 120 mL of dehydrated toluene were added to a 300 mL four-necked flask that had been separately prepared, and the mixture was cooled to −20° C. The solution prepared in advance was dropped into the mixture, and the temperature of the whole was increased to room temperature, followed by stirring for 18 hours. The reaction solution was filtered, and the solvent was distilled off under slightly reduced pressure, followed by distillation under reduced pressure. Thus, 13.1 g of Intermediate 2 was obtained. 5.03 g (0.016 mol) of Intermediate 2 and 35 mL of dehydrated toluene were added to a 100 mL two-necked flask, and the mixture was cooled to −20° C. 27 mL of a diethyl ether solution containing methyllithium (methyllithium content: 1.17 mol/L) was dropped into the mixture, and the temperature of the whole was increased to room temperature, followed by stirring for 18 hours. The reaction solution was filtered, and the solvent was distilled off under slightly reduced pressure, followed by distillation under reduced pressure. Thus, 3.19 g of a target product that was a pale yellow liquid was obtained (yield: 73%).
(Analytic Values)
(1) $^1$H-NMR (Solvent: Deuterated Benzene) (Chemical Shift:Multiplicity:Number of Hs)
(−0.01:s:6), (0.71:t:6), (1.46:sext:4), (1.61:s:6), (3.00-3.04:m:4), (4.33:s:1)
(2) Elemental Analysis (Metal Analysis: ICP-AES)
Ga: 24.9 mass %, C: 55.7 mass %, H: 9.4 mass %, N: 10.0 mass %
(theoretical values; Ga: 24.80 mass %, C: 55.55 mass %, H: 9.68 mass %, N: 9.97 mass %)

[Example 3] Production of Compound No. 44

Under an Ar atmosphere, 7.03 g (0.022 mol) of Intermediate 2 described in Example 2 and 35 mL of dehydrated toluene were added to a 200 mL four-necked flask, and the mixture was cooled to −20° C. 20 mL of a dehydrated toluene solution containing 2.62 g (0.046 mol) of lithium dimethylamide was dropped into the mixture, and the temperature of the whole was increased to room temperature, followed by stirring for 18 hours. The reaction solution was filtered, and the solvent was distilled off under slightly reduced pressure, followed by distillation under reduced pressure. Thus, 2.44 g of a target product that was a pale yellow liquid was obtained (yield: 33%).

(Analytic Values)
(1) $^1$H-NMR (Solvent: Deuterated Benzene) (Chemical Shift:Multiplicity:Number of Hs)
(0.78:t:6), (1.55-1.61:m:4), (1.62:s:6), (2.97:s:12), (3.13-3.17:m:4), (4.29:s:1)
(2) Elemental Analysis (Metal Analysis: ICP-AES)
Ga: 20.7 mass %, C: 53.3 mass %, H: 9.5 mass %, N: 16.5 mass %
(theoretical values; Ga: 20.56 mass %, C: 53.12 mass %, H: 9.81 mass %, N: 16.52 mass %)

[Example 4] Production of Compound No. 152

Under an Ar atmosphere, 16.3 g (0.115 mol) of N-propyl-4-imino-2-pentanone and 120 mL of dehydrated toluene were added to a 300 mL four-necked flask, and the mixture was cooled to −20° C. 73 mL of a n-hexane solution containing n-butyllithium (n-butyllithium content: 1.58 mol/L) was dropped into the mixture, and the temperature of the whole was increased to room temperature, followed by stirring for 2 hours. 19.8 g (0.112 mol) of gallium chloride and 230 mL of dehydrated toluene were added to a 1 L four-necked flask that had been separately prepared, and the mixture was cooled to −20° C. The solution prepared in advance was dropped into the mixture, and the temperature of the whole was increased to room temperature, followed by stirring for 18 hours. The reaction solution was filtered, and the solvent was distilled off under slightly reduced pressure. Thus, Intermediate 3 was obtained in a crude yield of 26.4 g. 6.04 g (0.021 mol) of Intermediate 3 and 45 mL of dehydrated toluene were added to a 100 mL two-necked flask, and the mixture was cooled to −20° C. 37 mL of a diethyl ether solution containing methyllithium (methyllithium content: 1.17 mol/L) was dropped into the mixture, and the temperature of the whole was increased to room temperature, followed by stirring for 18 hours. The reaction solution was filtered, and the solvent was distilled off under slightly reduced pressure, followed by distillation under reduced pressure. Thus, 2.41 g of a target product that was a pale yellow liquid was obtained (yield: 47%).
(Analytic Values)
(1) $^1$H-NMR (Solvent: Deuterated Benzene) (Chemical Shift:Multiplicity:Number of Hs)
(0.04:s:6), (0.58:t:3), (1.26-1.32:m:2), (1.32:s:3), (1.85:s:3), (2.79-2.83:m:2), (4.63:s:1)
(2) Elemental Analysis (Metal Analysis: ICP-AES)
Ga: 29.1 mass %, C: 50.3 mass %, H: 8.2 mass %, N: 5.8 mass %, O: 6.6 mass %
(theoretical values; Ga: 29.04 mass %, C: 50.05 mass %, H: 8.40 mass %, N: 5.84 mass %, O: 6.67 mass %)
<Production of Indium Compounds>
The production results of indium compounds are described in Examples 5 to 7 below.

[Example 5] Production of Compound No. 77

Under an Ar atmosphere, 3.51 g (0.022 mol) of trimethylindium and 40 mL of dehydrated toluene were added to a 100 mL two-necked flask. 3.38 g (0.022 mol) of N,N-diethyl-2,4-pentanediimine was dropped into the mixture, and the whole was stirred at room temperature for 18 hours. The solvent was distilled off under slightly reduced pressure, and then distillation was performed under reduced pressure to provide 5.60 g of a target product that was a yellow liquid (yield: 86%).

(Analytic Values)
(1) $^1$H-NMR (Solvent: Deuterated Benzene) (Chemical Shift:Multiplicity:Number of Hs)
(0.06:s:6), (0.97:t:6), (1.63:s:6), (3.02:q:4), (4.27:s:1)
(2) Elemental Analysis (Metal Analysis: ICP-AES)
In: 38.4 mass %, C: 44.7 mass %, H: 7.9 mass %, N: 9.0 mass %
(theoretical values; In: 38.50 mass %, C: 44.32 mass %, H: 7.78 mass %, N: 9.40 mass %)

[Example 6] Production of Compound No. 80

Under an Ar atmosphere, 3.01 g (0.019 mol) of trimethylindium and 40 mL of dehydrated toluene were added to a 100 mL two-necked flask. 3.44 g (0.019 mol) of N,N-dipropyl-2,4-pentanediimine was dropped into the mixture, and the whole was stirred at room temperature for 18 hours. The solvent was distilled off under slightly reduced pressure, and then distillation was performed under reduced pressure to provide 4.68 g of a target product that was a yellow liquid (yield: 76%).
(Analytic Values)
(1) $^1$H-NMR (Solvent: Deuterated Benzene) (Chemical Shift:Multiplicity:Number of Hs)
(0.07:s:6), (0.71:t:6), (1.46:sext:4), (1.68:s:6), (3.01-3.04:m:4), (4.30:s:1)
(2) Elemental Analysis (Metal Analysis: ICP-AES)
In: 35.2 mass %, C: 48.1 mass %, H: 8.1 mass %, N: 8.6 mass %
(theoretical values; In: 35.20 mass %, C: 47.87 mass %, H: 8.34 mass %, N: 8.59 mass %)

[Example 7] Production of Compound No. 224

Under an Ar atmosphere, 3.02 g (0.019 mol) of trimethylindium and 40 mL of dehydrated toluene were added to a 100 mL two-necked flask. 2.69 g (0.019 mol) of N-propyl-4-imino-2-pentanone was dropped into the mixture, and the whole was stirred at room temperature for 18 hours. The solvent was distilled off under slightly reduced pressure, and then distillation was performed under reduced pressure to provide 4.47 g of a target product that was a pale yellow solid (melting point: 44° C.) (yield: 84%).
(Analytic Values)
(1) $^1$H-NMR (Solvent: Deuterated Benzene) (Chemical Shift:Multiplicity:Number of Hs)
(0.07:s:6), (0.58:t:3), (1.22-1.32:m:2), (1.41:s:3), (1.95:s:3), (2.77-2.81:m:2), (4.67:s:1)
(2) Elemental Analysis (Metal Analysis: ICP-AES)
In: 40.3 mass %, C: 42.3 mass %, H: 6.9 mass %, N: 4.8 mass %, O: 5.7 mass %
(theoretical values; In: 40.28 mass %, C: 42.13 mass %, H: 7.07 mass %, N: 4.91 mass %, O: 5.61 mass %)

Evaluation Examples

The compounds of the present invention obtained in Examples 1 to 4 and Comparative Compound 1 below were subjected to the following evaluations.
(1) Melting Point Evaluation
The state of each of the compounds at 20° C. was visually observed. Regarding a compound that was a solid at 20° C., its melting point was measured with a minute melting point-measuring device. The results are shown in Table 1.
(2) Temperature (° C.) at the Time of 50 Mass % Loss in Normal-Pressure TG-DTA
The weight of a test compound was measured with a TG-DTA under normal pressure at an Ar flow rate of 100 mL/min and a temperature increase rate of 10° C./min in the scanning temperature range of from 30° C. to 600° C., and the temperature (° C.) at which the weight of the test compound reduced by 50 mass % was evaluated as a "temperature (° C.) at the time of a 50 mass % loss in normal-pressure TG-DTA." The results are shown in Table 1.

(3) Temperature (° C.) at the Time of 50 Mass % Loss in Reduced-Pressure TG-DTA

The weight of a test compound was measured with a TG-DTA at 10 Torr, an Ar flow rate of 50 mL/min, and a temperature increase rate of 10° C./min in the scanning temperature range of from 30° C. to 600° C., and the temperature (° C.) at which the weight of the test compound reduced by 50 mass % was evaluated as a "temperature (° C.) at the time of a 50 mass % loss in reduced-pressure TG-DTA." A lower temperature (° C.) at the time of a 50 mass % loss in reduced-pressure TG-DTA means that vapor is obtained at lower temperatures. The results are shown in Table 1.

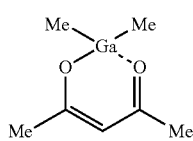

Comparative Compound 1

TABLE 1

| Compound | State at 20° C. | Melting point [° C.] | Normal-pressure TG-DTA Temperature at the time of 50 mass % loss [° C.] | Reduced-pressure TG-DTA Temperature at the time of 50 mass % loss [° C.] |
|---|---|---|---|---|
| Evaluation Example 1 | No. 5 | Liquid | — | 172 | 95 |
| Evaluation Example 2 | No. 8 | Liquid | — | 187 | 109 |
| Evaluation Example 3 | No. 44 | Liquid | — | 208 | 127 |
| Evaluation Example 4 | No. 152 | Liquid | — | 159 | 82 |
| Comparative Evaluation Example 1 | Comparative Compound 1 | Solid | 25 | Not measured | Not measured |

As shown in Table 1 above, each of Compounds No. 5, No. 8, No. 44, and No. 152 was a liquid at 20° C. Meanwhile, Comparative Compound 1 was a solid at 20° C., and hence had a melting point higher than those of the compounds of the present invention.

Evaluation Examples

The compounds of the present invention obtained in Examples 5 to 7 and Comparative Compound 2 below were subjected to the following evaluations.
(1) Melting Point Evaluation The state of each of the compounds at 20° C. was visually observed. Regarding a compound that was a solid at 20° C., its melting point was measured with a minute melting point-measuring device. The results are shown in Table 2.

(2) Temperature (° C.) at the Time of 50 Mass % Loss in Normal-Pressure TG-DTA

The weight of a test compound was measured with a TG-DTA under normal pressure at an Ar flow rate of 100 mL/min and a temperature increase rate of 10° C./min in the scanning temperature range of from 30° C. to 600° C., and the temperature (° C.) at which the weight of the test compound reduced by 50 mass % was evaluated as a "temperature (° C.) at the time of a 50 mass % loss in normal-pressure TG-DTA." The results are shown in Table 2.

(3) Temperature (° C.) at the Time of 50 Mass % Loss in Reduced-Pressure TG-DTA

The weight of a test compound was measured with a TG-DTA at 10 Torr, an Ar flow rate of 50 mL/min, and a temperature increase rate of 10° C./min in the scanning temperature range of from 30° C. to 600° C., and the temperature (° C.) at which the weight of the test compound reduced by 50 mass % was evaluated as a "temperature (° C.) at the time of a 50 mass % loss in reduced-pressure TG-DTA." A lower temperature (° C.) at the time of a 50 mass % loss in reduced-pressure TG-DTA means that vapor is obtained at lower temperatures. The results are shown in Table 2.

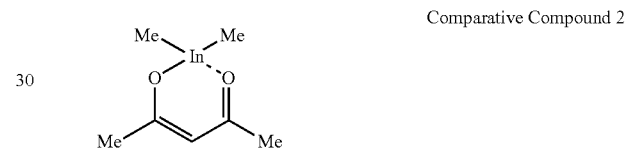

Comparative Compound 2

TABLE 2

| Compound | State at 20° C. | Melting point [° C.] | Normal-pressure TG-DTA Temperature at the time of 50 mass % loss [° C.] | Reduced-pressure TG-DTA Temperature at the time of 50 mass % loss [° C.] |
|---|---|---|---|---|
| Evaluation Example 5 | No. 77 | Liquid | — | 177 | 105 |
| Evaluation Example 6 | No. 80 | Liquid | — | 192 | 115 |
| Evaluation Example 7 | No. 224 | Solid | 43 | 164 | 92 |
| Comparative Evaluation Example 2 | Comparative Compound 2 | Solid | 138 | Not measured | Not measured |

As shown in Table 2 above, each of Compounds No. 77 and No 80 was a liquid at 20° C. In addition, Compound No. 224 was a solid at 20° C., but had a relatively low melting point of 43° C. Meanwhile, Comparative Compound 2 was a solid at 20° C., and hence had a melting point even higher than those of the compounds of the present invention.

[Examples 8 to 14 and Comparative Examples 1 to 3] Production of Nitride Films by ALD Method A gallium nitride thin-film or an indium nitride thin-film was produced on a silicon substrate by the ALD method under the following conditions through use of an ALD apparatus illustrated in FIG. 1 with each of the compounds of the present invention obtained in Examples 1 to 7, Comparative Compounds 1 and 2, and Comparative Compound 3 below being used as a chemical vapor deposition raw material. Regarding each of the obtained thin-films, a film thickness was measured by an X-ray reflectivity method, a compound of the thin-film was identified by an X-ray diffraction method, and the content of carbon in the thin-film was measured by X-ray photoelectron spectroscopy. The results are shown in Table 3.

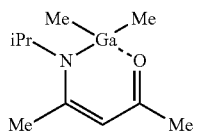

Comparative Compound 3

(Conditions)

Reaction temperature (substrate temperature): 200° C., reactive gas: ammonia (Steps)

A series of the following steps (1) to (4) was defined as one cycle, and this cycle was repeated 150 times:

(1) vapor of a chemical vapor deposition raw material vaporized under the conditions of a raw material container heating temperature of 90° C. and a raw material container internal pressure of 100 Pa is introduced, and the raw material is deposited at a system pressure of 100 Pa for 30 seconds;

(2) an unreacted raw material is removed through argon purging for 10 seconds;

(3) a reactive gas is introduced and subjected to a reaction at a system pressure of 100 Pa for 30 seconds; and (4) the unreacted raw material is removed through argon purging for 10 seconds.

TABLE 3

| | Chemical vapor deposition raw material | Film thickness of thin-film | Compound of thin-film | Content of carbon in thin-film |
|---|---|---|---|---|
| Example 8 | No. 5 | 8.0 nm | Gallium nitride | Undetectable*[1] |
| Example 9 | No. 8 | 8.0 nm | Gallium nitride | Undetectable*[1] |
| Example 10 | No. 44 | 6.5 nm | Gallium nitride | Undetectable*[1] |
| Example 11 | No. 152 | 7.0 nm | Gallium nitride | Undetectable*[1] |
| Comparative Example 1 | Comparative Compound 1 | 2.5 nm | Gallium nitride | 5 atm % |
| Comparative Example 3 | Comparative Compound 3 | 3.5 nm | Gallium nitride | 10 atm % |
| Example 12 | No. 77 | 7.5 nm | Indium nitride | Undetectable*[1] |
| Example 13 | No. 80 | 7.0 nm | Indium nitride | Undetectable*[1] |
| Example 14 | No. 224 | 7.0 nm | Indium nitride | Undetectable*[1] |
| Comparative Example 2 | Comparative Compound 2 | 2.0 nm | Indium nitride | 5 atm % |

*[1]The detection limit is 0.1 atm %.

The content of carbon in the nitride film obtained by the ALD method is 5 atm % or more in each of Comparative Examples 1 to 3, whereas the content of carbon is less than 0.1 atm % that is the detection limit in each of Examples 8 to 14. That is, it was shown that a high-quality nitride film was obtained through use of each of the gallium compound and indium compound of the present invention. In addition, the film thickness of the obtained nitride film is 3.5 nm or less in each of Comparative Example 1 to 3, whereas the film thickness is 6.0 nm or more in each of Examples 8 to 14.

Thus, the nitride film was obtained with high productivity through use of each of the gallium compound and indium compound of the present invention. In particular, the nitride film was able to be obtained with higher productivity when each of Compound No. 5 and Compound No. 8 was used as a chemical vapor deposition raw material, and hence it was shown that each of Compound No. 5 and Compound No. 8 was particularly excellent as a chemical vapor deposition raw material.

[Examples 15 to 21 and Comparative Examples 4 to 6] Production of Oxide Films by ALD Method A gallium oxide thin-film or an indium oxide thin-film was produced on a silicon substrate by the ALD method under the following conditions through use of an ALD apparatus illustrated in FIG. 1 with each of the compounds of the present invention obtained in Examples 1 to 7 and Comparative Compounds 1 to 3 being used as a chemical vapor deposition raw material. Regarding each of the obtained thin-films, a film thickness was measured by an X-ray reflectivity method, a compound of the thin-film was identified by an X-ray diffraction method, and the content of carbon in the thin-film was measured by X-ray photoelectron spectroscopy. The results are shown in Table 4.

(Conditions)

Reaction temperature (substrate temperature): 200° C., reactive gas: ozone (Steps)

A series of the following steps (1) to (4) was defined as one cycle, and this cycle was repeated 150 times:

(1) vapor of a chemical vapor deposition raw material vaporized under the conditions of a raw material container heating temperature of 90° C. and a raw material container internal pressure of 100 Pa is introduced, and the raw material is deposited at a system pressure of 100 Pa for 30 seconds;

(2) an unreacted raw material is removed through argon purging for 10 seconds;

(3) a reactive gas is introduced and subjected to a reaction at a system pressure of 100 Pa for 30 seconds; and (4) the unreacted raw material is removed through argon purging for 10 seconds.

TABLE 4

| | Chemical vapor deposition raw material | Film thickness of thin-film | Compound of thin-film | Content of carbon in thin-film |
|---|---|---|---|---|
| Example 15 | No. 5 | 7.5 nm | Gallium oxide | Undetectable*[2] |
| Example 16 | No. 8 | 7.5 nm | Gallium oxide | Undetectable*[2] |
| Example 17 | No. 44 | 6.5 nm | Gallium oxide | Undetectable*[2] |
| Example 18 | No. 152 | 6.0 nm | Gallium oxide | Undetectable*[2] |
| Comparative Example 4 | Comparative Compound 1 | 2.0 nm | Gallium oxide | 5 atm % |
| Comparative Example 6 | Comparative Compound 3 | 3.0 nm | Gallium oxide | 10 atm % |
| Example 19 | No. 77 | 6.5 nm | Indium oxide | Undetectable*[2] |
| Example 20 | No. 80 | 6.0 nm | Indium oxide | Undetectable*[2] |
| Example 21 | No. 224 | 5.5 nm | Indium oxide | Undetectable*[2] |
| Comparative Example 5 | Comparative Compound 2 | 1.5 nm | Indium oxide | 5 atm % |

*[2]The detection limit is 0.1 atm %.

The content of carbon in the oxide film obtained by the ALD method is 5 atm % or more in each of Comparative Examples 4 to 6, whereas the content of carbon is less than 0.1 atm % that is the detection limit in each of Examples 15 to 21. That is, it was shown that a high-quality oxide film was obtained through use of each of the gallium compound and indium compound of the present invention. In addition, the film thickness of the obtained oxide film is 3.0 nm or less in each of Comparative Examples 4 to 6, whereas the film thickness is 5.5 nm or more in each of Examples 15 to 21. Thus, the oxide film was obtained with high productivity through use of each of the gallium compound and indium compound of the present invention. In particular, the oxide film was able to be obtained with higher productivity when each of Compound No. 5 and Compound No. 8 was used as a chemical vapor deposition raw material, and hence it was shown that each of Compound No. 5 and Compound No. 8 was particularly excellent as a chemical vapor deposition raw material.

The invention claimed is:

1. A compound represented by the following general formula (1), or compound No. 224:

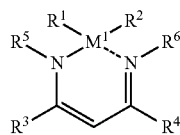
(1)

where $R^1$ to $R^4$ each independently represent an alkyl group having 1 to 5 carbon atoms, or a group represented by the following general formula (X-1), (X-2), or (X-3), $R^5$ and $R^6$ each independently represent an alkyl group having 1 to 5 carbon atoms, $M^1$ represents a gallium atom or an indium atom, and part or all of hydrogen atoms in the alkyl group having 1 to 5 carbon atoms represented by each of $R^1$ to $R^6$ may each be substituted with a fluorine atom;

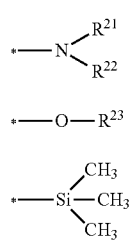

where $R^{21}$ to $R^{23}$ each independently represent an alkyl group having 1 to 5 carbon atoms, and * represents a bonding site;

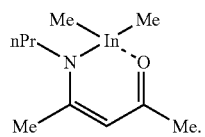
No.224

2. The compound according to claim 1, wherein the compound is represented by the general formula (1), $R^1$ and $R^2$ each independently represent an alkyl group having 1 to 3 carbon atoms or a group represented by the general formula (X-1), $R^3$ and $R^4$ each independently represent an alkyl group having 1 to 3 carbon atoms, and $R^5$ and $R^6$ each independently represent an alkyl group having 1 to 5 carbon atoms.

3. A thin-film forming raw material, comprising the compound of claim 1.

4. A method of producing a thin-film, comprising the steps of:
   introducing a raw material gas obtained by vaporizing the thin-film forming raw material of claim 3 into a treatment atmosphere in which a substrate is set; and
   subjecting the compound in the raw material gas to decomposition and/or a chemical reaction, to thereby form a thin-film containing a gallium atom or an indium atom on a surface of the substrate.

5. A thin-film forming raw material, comprising the compound of claim 2.

6. A method of producing a thin-film, comprising the steps of:
   introducing a raw material gas obtained by vaporizing the thin-film forming raw material of claim 5 into a treatment atmosphere in which a substrate is set; and
   subjecting the compound in the raw material gas to decomposition and/or a chemical reaction, to thereby form a thin-film containing a gallium atom or an indium atom on a surface of the substrate.

7. A compound represented by Compound No. 152:

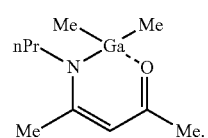
No.152

8. A thin-film forming raw material, comprising the compound of claim 7.

9. A method of producing a thin-film, comprising the steps of:
   introducing a raw material gas obtained by vaporizing the thin-film forming raw material of claim 8 into a treatment atmosphere in which a substrate is set; and
   subjecting the compound in the raw material gas to decomposition and/or a chemical reaction, to thereby form a thin-film containing a gallium atom or an indium atom on a surface of the substrate.

* * * * *